US011233184B2

(12) United States Patent
Ukawa et al.

(10) Patent No.: US 11,233,184 B2
(45) Date of Patent: Jan. 25, 2022

(54) LIGHT-EMITTING DEVICE AND METHOD FOR MANUFACTURING THE SAME

(71) Applicant: NICHIA CORPORATION, Anan (JP)

(72) Inventors: Hiroaki Ukawa, Itano-gun (JP);
Ryuichi Nakagami, Anan (JP); Ryuji Muranaka, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/835,319

(22) Filed: Mar. 31, 2020

(65) Prior Publication Data

US 2020/0313058 A1 Oct. 1, 2020

(30) Foreign Application Priority Data

Apr. 1, 2019 (JP) .............................. JP2019-069758

(51) Int. Cl.
*H01L 33/60* (2010.01)
*H01L 33/62* (2010.01)
*H01L 33/46* (2010.01)
*H01L 23/00* (2006.01)
*H01L 33/58* (2010.01)

(52) U.S. Cl.
CPC .............. *H01L 33/60* (2013.01); *H01L 24/45* (2013.01); *H01L 33/46* (2013.01); *H01L 33/58* (2013.01); *H01L 33/62* (2013.01); *H01L 2933/0066* (2013.01)

(58) Field of Classification Search
CPC ......... H01L 33/62; H01L 33/46; H01L 33/58; H01L 24/45; H01L 2933/0066; H01L 33/60
See application file for complete search history.

(56) References Cited

U.S. PATENT DOCUMENTS

| 2011/0186868 A1* | 8/2011 | Watari | .................... | H01L 24/49 |
| | | | | 257/88 |
| 2012/0007112 A1* | 1/2012 | Yamada | .................. | H01L 33/62 |
| | | | | 257/88 |
| 2012/0193665 A1* | 8/2012 | Yamada | .................. | H01L 24/17 |
| | | | | 257/98 |

(Continued)

FOREIGN PATENT DOCUMENTS

| JP | 2012-142430 | 7/2012 |
| JP | 2014-209602 | 11/2014 |
| JP | 2015-115407 | 6/2015 |

*Primary Examiner* — Feifei Yeung Lopez
(74) *Attorney, Agent, or Firm* — Mori & Ward, LLP

(57) ABSTRACT

A light-emitting device includes: a light-emitting element; a base including a first lead having an element disposal portion and a first wire bonding portion, a second lead having a second wire bonding portion and a fixing member; a frame provided on a upper surface of the base; an Ag plating layer covering an upper surface of the element disposal portion; an Au plating layer covering at least an upper surface of the first wire bonding portion and at least an upper surface of the second wire bonding portion; a first wire; and a second wire. The Ag plating layer is disposed apart inwardly from at least a part of an outer circumference of an end portion of the element disposal portion, and the frame body is provided at a position that the frame body covers the Ag plating layer, the first wire bonding portion, and the second wire bonding portion.

20 Claims, 12 Drawing Sheets

(56) References Cited

U.S. PATENT DOCUMENTS

| | | | |
|---|---|---|---|
| 2014/0175595 A1* | 6/2014 | Oka | H01L 25/0753 257/499 |
| 2014/0291716 A1* | 10/2014 | Ukawa | H01L 33/56 257/98 |
| 2017/0288104 A1* | 10/2017 | Ukawa | H01L 33/62 |
| 2021/0066552 A1* | 3/2021 | Kim | H01L 33/00 |

* cited by examiner

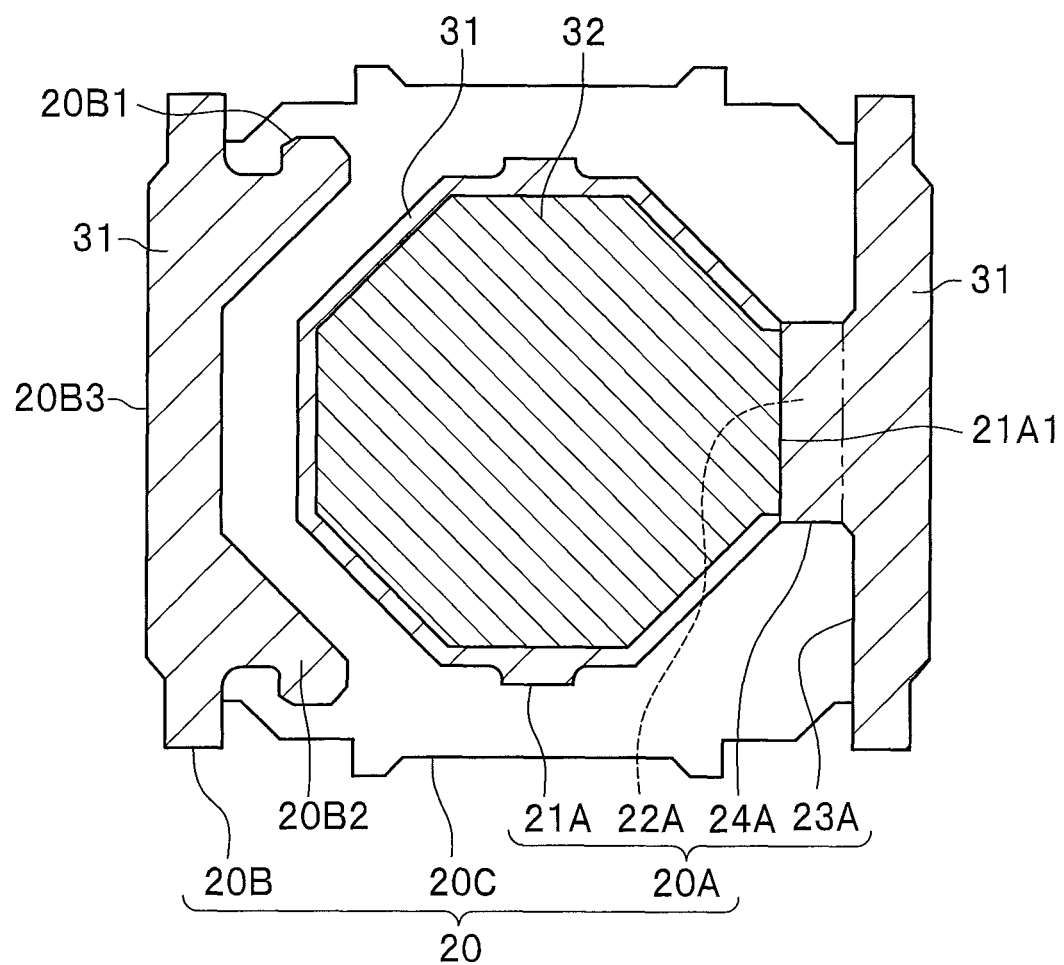

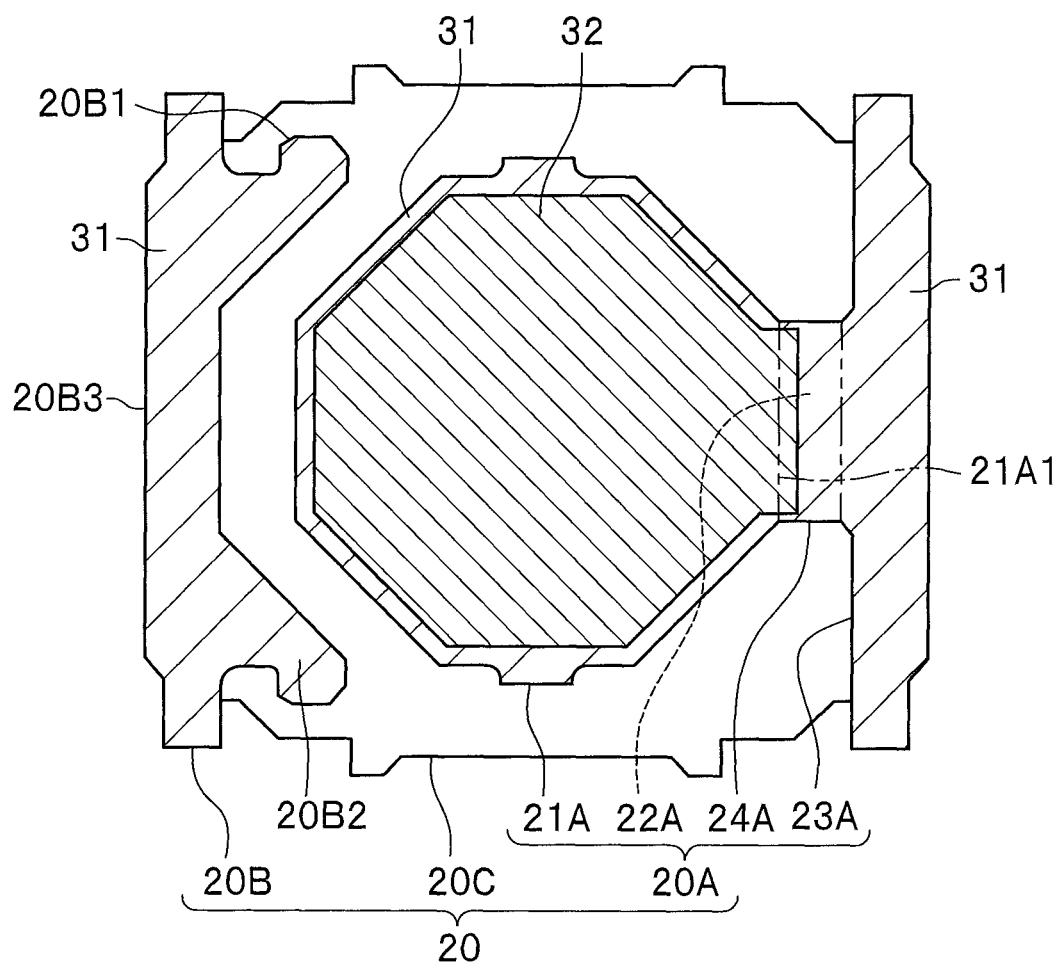

LIGHT-EMITTING DEVICE AND METHOD FOR MANUFACTURING THE SAME

CROSS-REFERENCE TO RELATED APPLICATIONS

This application claims the benefit of priority from Japanese Patent Application No. 2019-069758 filed on Apr. 1, 2019, the entire contents of which are incorporated herein by reference.

BACKGROUND

Field of the Invention

The present disclosure relates to a light-emitting device and a method for manufacturing the light-emitting device.

Description of Related Art

A light-emitting device using a light-emitting element such as a light emitting diode and a laser diode is used in many fields including general lightings such as an outdoor lighting and an interior lighting, a light source for automotive, and a backlight of an LCD display. Such a light emitting device can include a light-emitting element disposed on the upper surface of a lead, a resin frame surrounding a circumference of a light-emitting element, a first sealing resin filled in the resin frame and sealing the light-emitting device, and a second sealing resin covering a resin frame and the first sealing resin (see, e.g., Japanese Patent Application Publication No. 2014-209602).

SUMMARY

Embodiments herein set forth a light-emitting device including a light-emitting element, and a base including: a first lead including an element disposal portion on which the light-emitting element is disposed and a first wire bonding portion flush with the element disposal portion; a second lead including a second wire bonding portion; and a fixing member fixing the first lead and the second lead together. The light-emitting device further includes a frame body provided on an upper surface of the base to surround the light-emitting element, an Ag plating layer containing a primary component of Ag and covering an upper surface of the element disposal portion, an Au plating layer containing a primary component of Au and covering at least an upper surface of the first wire bonding portion and at least an upper surface of the second wire bonding portion, a first wire electrically connecting the light-emitting element and the first wire bonding portion, and a second wire electrically connecting the light-emitting element and the second wire bonding portion. The Ag plating layer is disposed apart inwardly from at least a part of an outer circumference of an end portion of the element disposal portion in a top view, and the frame body is provided at such a position that the frame body covers an end portion of the Ag plating layer, the first wire bonding portion, and the second wire bonding portion.

Embodiments herein set forth a method of manufacturing a light-emitting device including preparing a base including: a first lead including an element disposal portion and a first wire bonding portion; a second lead including a second wire bonding portion; and a fixing member fixing the first lead and the second lead together, by providing an Au plating layer containing a primary component of Au on at least an upper surface of the first wire bonding portion and at least an upper surface of the second wire bonding portion, and providing an Ag plating layer containing a primary component of Ag disposed apart inwardly from at least a part of an outer circumference of an end portion of the element disposal portion on an upper surface of the element disposal portion in a top view. The method further includes disposing a light-emitting element on the upper surface of the element disposal portion, electrically connecting the light-emitting element and the first wire bonding portion together with a first wire and electrically connecting the light-emitting element and the second wire bonding portion together with a second wire, and forming a frame body on an upper surface of the base such that the frame body surrounds the light-emitting element and covers an end portion of the Ag plating layer, the first wire bonding portion, and the second wire bonding portion.

BRIEF DESCRIPTION OF THE DRAWINGS

The disclosure will become more fully understood from the following detailed description, taken in conjunction with the accompanying figures, in which:

FIG. 7B is a plan view corresponding to FIG. 7A showing another embodiment of the Ag plating layer in the first embodiment;

FIG. 7C is a plan view corresponding to FIG. 7A showing another embodiment of the Ag plating layer in the first embodiment;

DESCRIPTION OF EMBODIMENTS

Figure 1:
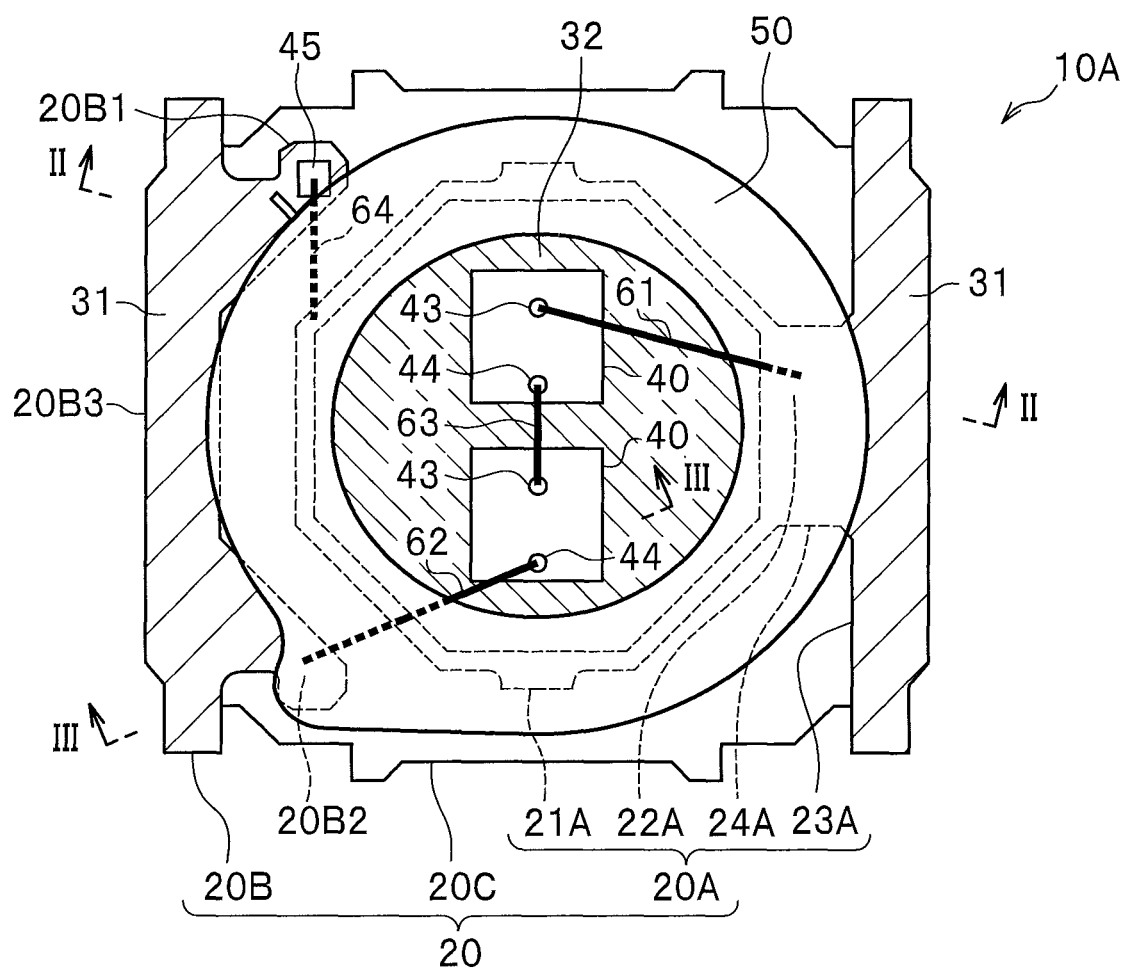
FIG. 1 is a plan view schematically showing a construction of the light-emitting device according to a first embodiment.

The light-emitting device and the method of manufacturing the same according to the embodiments will be described below with references to the drawings.

Note that the following embodiments are illustrative of a light-emitting device to achieve technical ideas of the present embodiments and are not limited to the followings. In addition, dimensions, materials, shapes, relative arrangements of components described in the embodiments are not intended to limit the scope if there are no specific descriptions, they are merely illustrative examples. Note that the size, positional relationship of the members shown in each drawing can be exaggerated for clarity of explanation.

In addition, in the following description, the same names and reference numerals show the same or the homogeneous members, and detailed descriptions will be omitted appropriately.

First Embodiment

<Construction of Light-Emitting Device>

Figure 2:
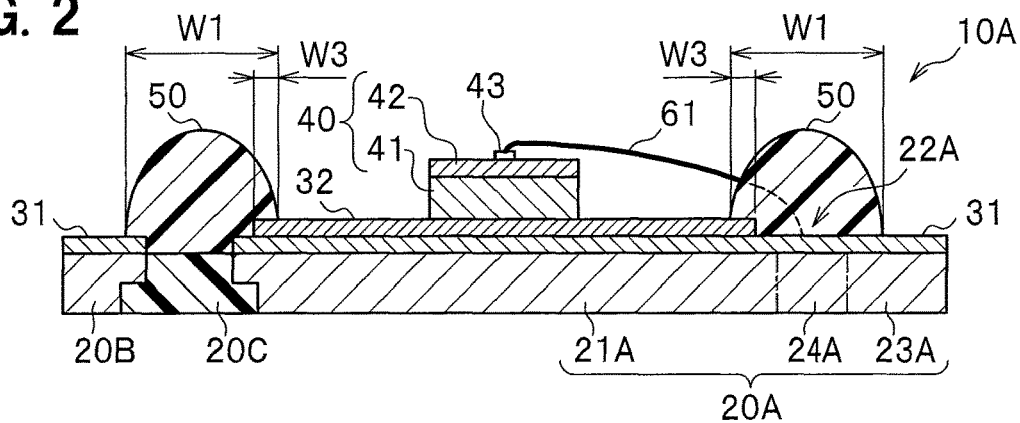
FIG. 2 is a cross-sectional view taken along II-II of FIG. 1.
Figure 3:
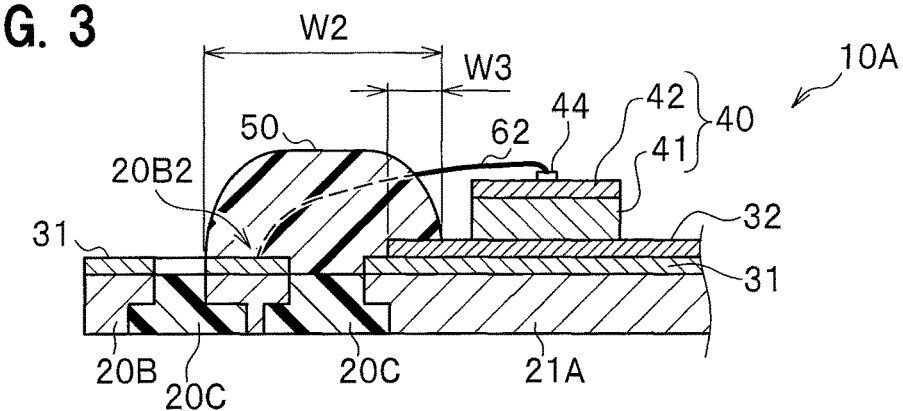
FIG. 3 is a cross-sectional view taken along III-III of FIG. 1.
Figure 4:
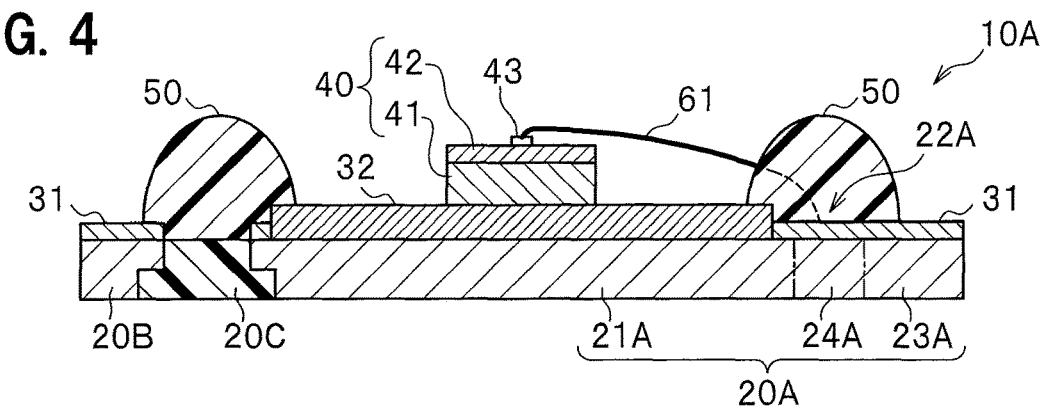
FIG. 4 is a cross-sectional view corresponding to FIG. 2 showing another embodiment of an Au plating layer in the first embodiment.
Figure 5:
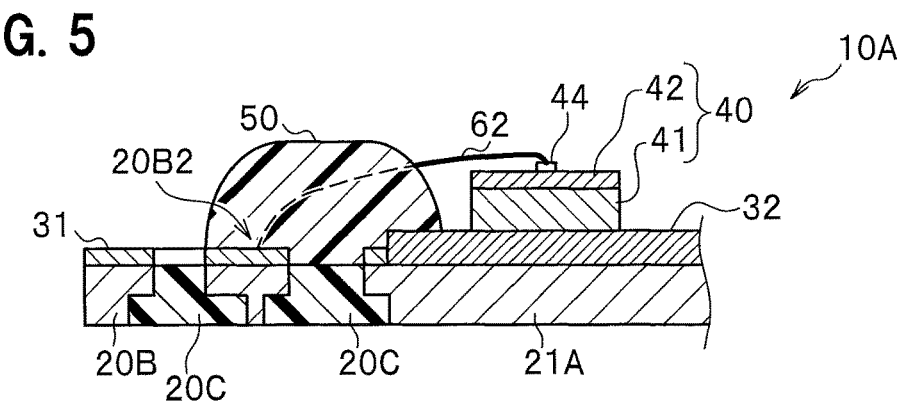
FIG. 5 is a cross-sectional view corresponding to FIG. 3 showing another embodiment of the Au plating layer in the first embodiment.
Figure 6:
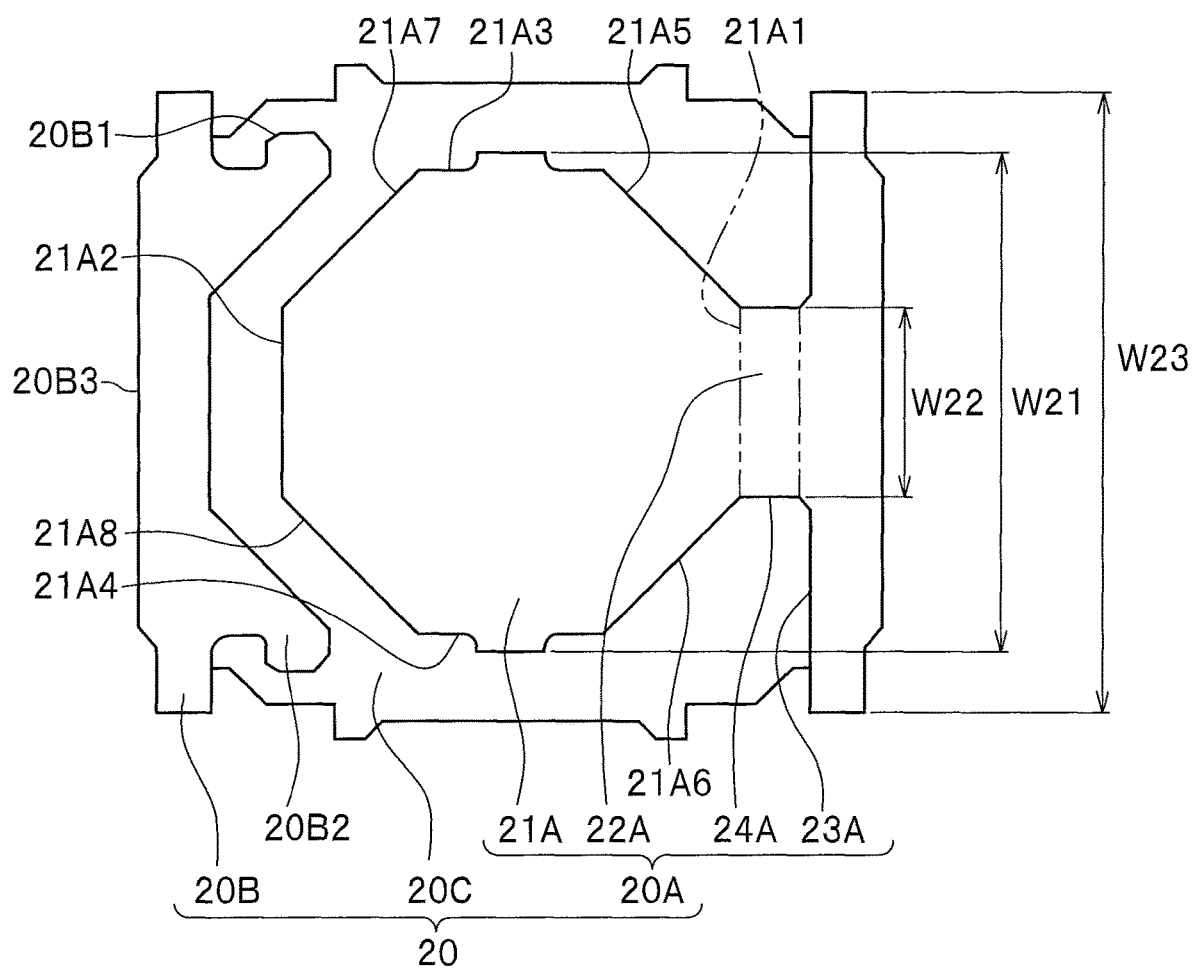
FIG. 6 is a plan view of the light-emitting device according to the first embodiment, where the Au plating layer, an Ag plating layer, the light-emitting elements and a frame body are omitted.
Figure 7A:
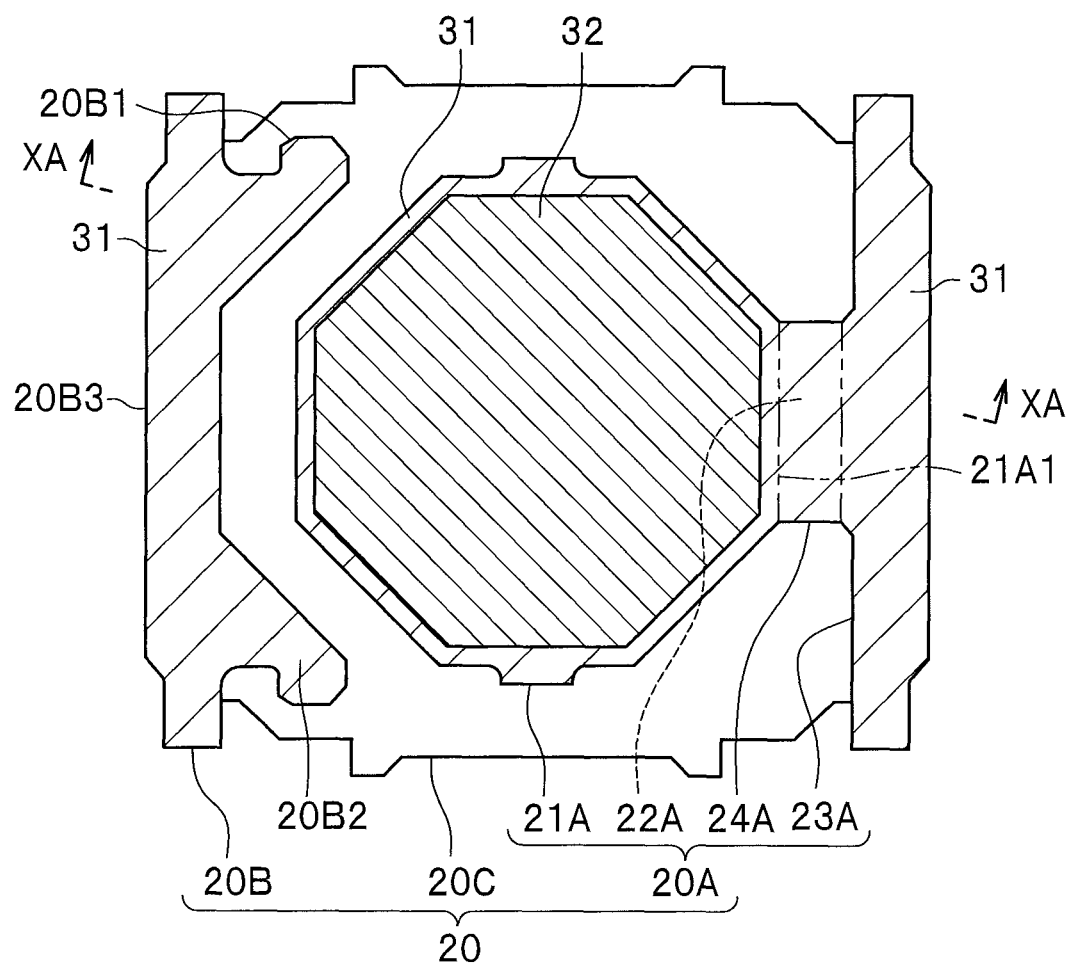
FIG. 7A is a plan view of the light-emitting device according to the first embodiment, where the light-emitting elements and the frame body are omitted.
Figure 8A:
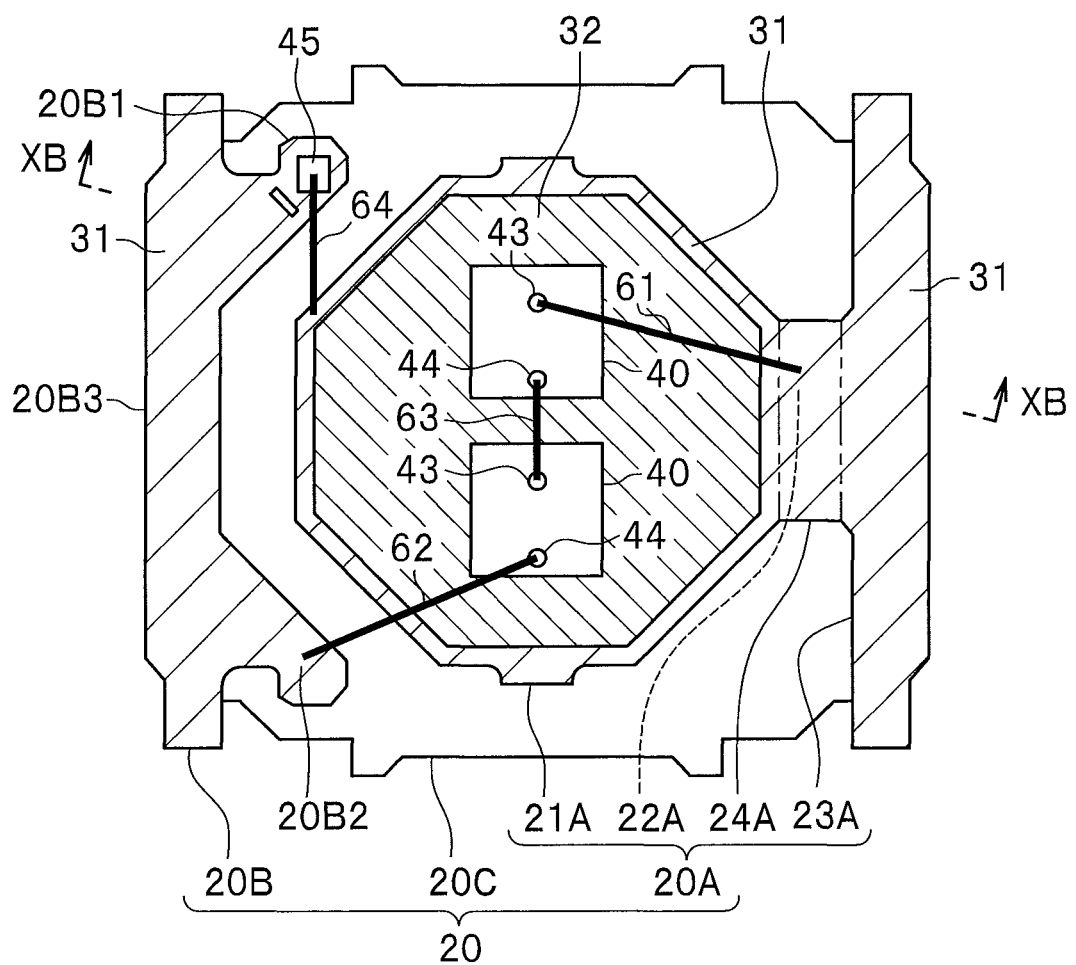
FIG. 8A is a plan view of the light-emitting device according to the first embodiment, where the frame body is omitted.
Figure 8B:
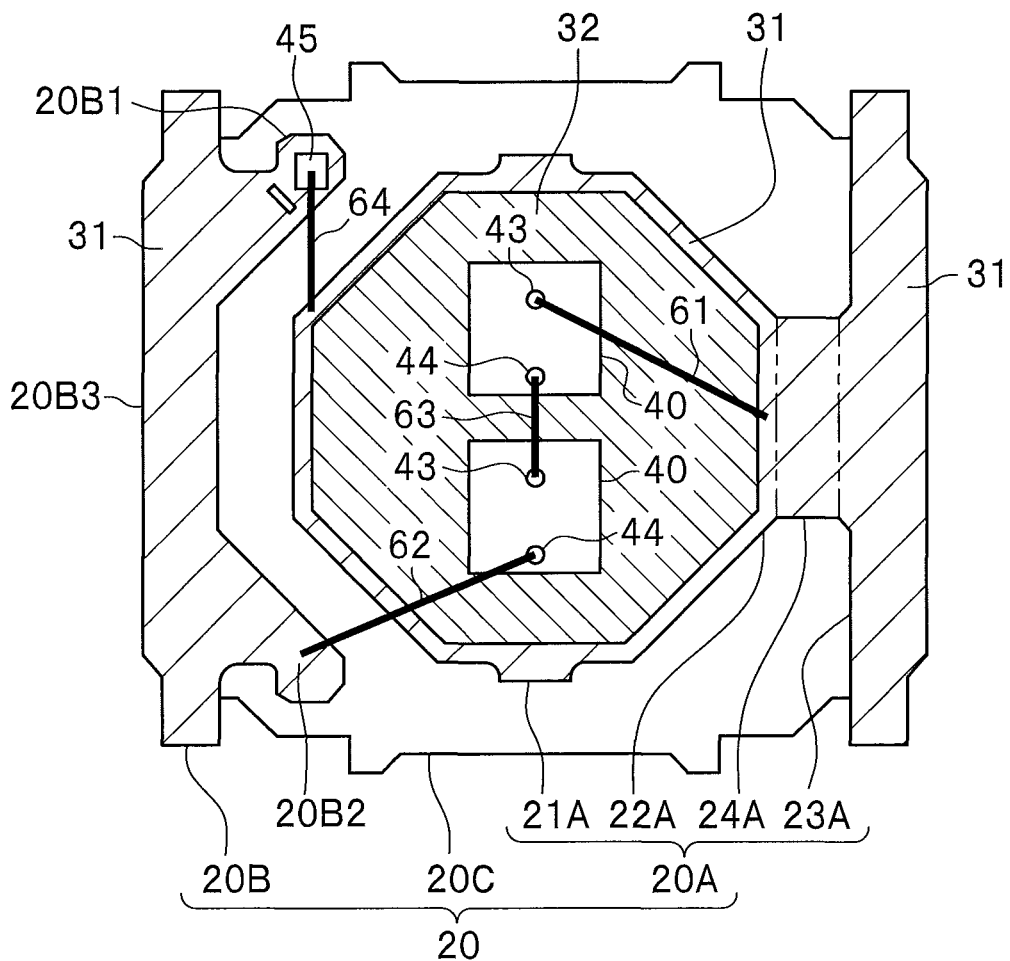
FIG. 8B is a plan view corresponding to FIG. 8A showing another embodiment of the first wire bonding portion in the first embodiment.

First, the light-emitting device according to a first embodiment will be described. FIG. 1 is a plan view schematically showing the construction of the light-emitting device according to the first embodiment. FIG. 2 is a cross-sectional view taken along II-II of FIG. 1. FIG. 3 is a cross-sectional view taken along III-III of FIG. 1. FIG. 4 is a cross-sectional view corresponding to FIG. 2 showing another embodiment of the Au plating layer in the first embodiment. FIG. 5 is a cross-sectional view corresponding to FIG. 3 showing another embodiment of the Au plating layer in the first embodiment. FIG. 6 is a plan view of the light-emitting device according to the first embodiment, where the Au plating layer, the Ag plating layer, light-emitting elements and the frame body are omitted. FIG. 7A is a plan view of the light-emitting device according to the first embodiment, where light-emitting elements and the frame body are omitted. FIG. 7B is a plan view corresponding to FIG. 7A showing another embodiment of the Ag plating layer in the first embodiment. FIG. 7C is a plan view corresponding to FIG. 7A showing another embodiment of the Ag plating layer in the first embodiment. FIG. 8A is a plan view of the light-emitting device according to the first embodiment, where the frame body is omitted. FIG. 8B is a plan view corresponding to FIG. 8A showing another embodiment of the first wire bonding portion in the first embodiment.

As shown in FIGS. 1 to 8B, a light-emitting device 10A includes: a light-emitting element 40; and a base 20 including: a first lead 20A including an element disposal portion 21A on which the light-emitting element 40 is disposed and a first wire bonding portion 22A flush with the element disposal portion 21A; a second lead 20B including a second wire bonding portion 20B2; and a fixing member 20C fixing the first lead 20A and the second lead 20B together. The light-emitting device 10A further includes: a frame body 50 provided on an upper surface of the base 20 to surround the light-emitting element 40; an Ag (silver) plating layer 32 containing a primary component of Ag and covering an upper surface of the element disposal portion 21A; an Au (gold) plating layer 31 containing a primary component of Au and covering at least an upper surface of the first wire bonding portion 22A and an upper surface of the second wire bonding portion 20B2; a first wire 61 electrically connecting the light-emitting element 40 and the first wire bonding portion 22A; and a second wire 62 electrically connecting the light-emitting element 40 and the second wire bonding portion 20B2, and the light-emitting device 40. The Ag plating layer 32 is disposed apart inwardly from at least a part of an outer circumference of an end portion of the element disposal portion 21A in a top view. The frame body 50 is provided at such a position that the frame body 50 covers an end portion of the Ag plating layer 32, the first wire bonding portion 22A and the second wire bonding portion 20B2.

(Light-Emitting Element, First Wire, Second Wire)

As shown in FIGS. 1 to 5, the light-emitting elements 40 are disposed on the upper surface of the element disposal portion 21A of the first lead 20A with the intervening Ag plating layer 32 and the Au plating layer 31, or the intervening the Ag plating layer 32. Each light-emitting element 40 is a semiconductor element emitting light by applying voltage, and has a light emitting surface on the upper surface. The number of the light-emitting elements 40 disposed on the upper surface of the element disposal portion 21A is not specifically limited. In the drawings, two light-emitting elements 40 are disposed on the upper surface of the element disposal portion 21A, however, one or three or more light emitting elements 40 can be disposed on the upper surface of the element disposal portion 21A.

Each light-emitting element 40 can include an element substrate 41 made of sapphire disposed on the base 20, and a semiconductor layer 42 made of a nitride semiconductor provided on the element substrate 41. The emission wavelengths of the light-emitting elements 40 are selected from the wavelengths from the ultraviolet region to the infrared region including the visible region (380 to 780 nm). For example, the light-emitting elements 40 having peak wavelengths of 430 to 490 rim employs $In_xAl_yGa_{1-X-Y}N$ ($0 \leq X$, $0 \leq Y$, $X+Y \leq 1$) as a nitride semiconductor. In addition, the light-emitting elements 40 can be disposed on the upper surface of the first lead 20A with an intervening sub mount.

Each light-emitting element 40 can have, in the top view, any shape of a polygon such as a triangle, a quadrangle, and a hexagon, shapes similar to these, or arbitrarily shape. Each light-emitting element 40 can have a construction with single-sided electrode where n-electrode 43 and p-electrode 44 are formed on the same side, or with a double-sided electrode where the n-electrode 43 and the p-electrode 44 are formed on two different surfaces (e.g. upper and lower surfaces). The n-electrode 43 of each light-emitting element 40 is connected to the Au plating layer 31 of the first wire joint portion 22A via the first wire 61. The p-electrode 44 is connected to the Au plating layer 31 of the second wire joint portion 20B2 via the second wire 62. Note that the n-electrode 43 and the p-electrode 44 of each light-emitting element 40 can be directly connected to the first lead 20A and the second lead 20B, respectively. The two light-emitting elements 40 use a third wire 63 for the connection between the elements, that is, the connection between the p-electrode 44 of one light-emitting element 40 and the n-electrode 43 of the other light-emitting element 40. The first wire 61, the second wire 62, and the third wire 63 each employs a metal material having an excellent conductivity such as gold, aluminum, copper, and silver.

When the light-emitting elements 40 are the single-sided electrodes, they are face-up mounted with the intervening Ag plating layer 32 disposed on the first lead 20A. The face-up mounting is the embodiment where the opposite surfaces to the electrode forming surfaces of the light-emitting elements 40 are mounted to face the base 20. The bonding member between the light-emitting elements 40 and Ag plating layer 32 can be an insulative bonding member or a conductive bonding member and employ a conventional joint member. An example of the insulative bonding member is an epoxy resin, a silicon resin or modified resins of these resins. The conductive bonding member is: a conductive paste such as silver, gold, and palladium; a solder such as eutectic Au—Sn; or a braze such as a low-melting point metal. In case of light-emitting elements 40 with double-sided electrodes, a joint member between the light-emitting elements 40 and Ag plating layer 32 can be a conductive member and employ any conventional members. An example of the conductive bonding member is: a conductive paste such as silver, gold and palladium; a solder such as eutectic Au—Sn; or a braze such as a low-melting point metal.

(Base)

As shown in FIG. 6, the base 20 has: the first lead 20A; second lead 20B; and the fixing member 20C fixing the first lead 20A and the second lead 20B with a condition of spacing apart. The upper surface of the first lead 20A, the upper surface of the second lead 20B and the lower surface of the fixing member 20C are placed on the same plane. The lower surface of the first lead 20A, the lower surface of the second lead 20B and the lower surface of the fixing member 20C are placed on the same plane surface. The first lead 20A, for example, is formed in an approximate polygon on the center of the base 20. The first lead 20A includes: an element disposal portion 21A including the mounting region of the light-emitting elements 40; and a terminal portion 23A disposed on the one end side of the base 20. The first lead 20A includes a connecting portion 24A provided with a first wire joint portion 22A which connects the element disposal portion 21A and the terminal portion 23A and electrically connects to the light-emitting element 40 via the first wire 61 (see FIG. 8A). Note that the first wire joint portion 22A can be provided not on the connecting portion 24A but on the outer circumference side of the end portion except the mounting region of the light-emitting elements 40 of the element disposal portion 21A, that is, not on an area with the Ag plating layer 32 but on an area with the Au plating layer 31. The width W22 of the connecting portion 24A is smaller than the width W21 of the element disposal portion 21A, also smaller than the width W23 of terminal portion 23A. The width W23 of the terminal portion 23A is larger than the width W21 of the element disposal portion 21A and is equal to that of the base 20. In the first lead 20A and the second lead 20B, the width is defined as a maximum length in a direction perpendicular to the direction of extending from the element disposal portion 21A to the connecting portion 24A. In addition, the element disposal portion 21A includes an octagonal portion in the top view. Furthermore, the element disposal portion 21A has: a first side 21A1 having a length equal to the width W22 of the first wire joint portion 22A; a second side 21A2 parallel to and opposite to the first side 21A1; a third side 21A3 orthogonal to the first side 21A1 and the second side 21A2; a fourth side orthogonal to the first side 21A1 and the second side 21A2 and opposite to the third side 21A3; a sloped fifth side 21A5 connecting the first side 21A1 and the third side 21A3; a sloped sixth side 21A6 connecting the first side 21A1 and the fourth side 21A4, a sloped seventh side 21A7 connecting the second side 21A2 and the third side 21A3; and a sloped eighth side 21A8 connecting the second side 21A2 and the fourth side 21A4. Furthermore, the element disposal portion 21A has a convex portion protruding from the third side 21A3 and the fourth side 21A4. This convex portion improves the holding force between fixing member 20C and the first lead 20A.

The distance between the second lead 20B and the second side 21A2 of the element disposal portion 21A is larger than that between the second lead 20B and the seventh side 21A7 or eighth side 21A8. The distance between the second lead 20B and the seventh side 21A7 is equal to that between the second lead 20B and the eighth side 21A8. The second lead 20B includes a terminal portion 20B3 having a width approximately equal to the width W23 of the terminal portion 23A. The terminal portion 20B3 includes bent portions 20B1 and 20B2 at one end and the other end in the longitudinal direction of the terminal portion 20B3. The bent portions 20B1 and 20B2 are bent toward the element disposal portion 21A and enlarge an area of the second terminal portion 20B3. On one bent portion, or the element disposal portion 20B1, the protection element 45 is disposed. The other bent portion, or the second wire bonding portion 20B2, electrically connects to the light-emitting elements 40 via the second wire 62.

In the top view, the area of first lead 20A can be larger than that of the second lead 20B. The light-emitting elements 40 is disposed on the upper surface of the element disposal portion 20A of first lead 20A. Thus, the large area of the element disposal portion 21A of the first lead 20A makes heat generated in the light-emitting elements 40 easily conducted to the first lead 20A. This inhibits temperature increase of the light-emitting elements and improves reliability of the light-emitting device 10.

The side surface of the first lead 20A and/or the second lead 20B can have a concave portion or a convex portion. The portion contacting the first lead 20A and/or the second lead 20B and the fixing member 20C includes a concave portion or a convex portion, which increases the contact area between the first lead 20A and/or the second lead 20B and the fixing member 20C. This improves the adhesiveness between the first lead 20A and/or the second lead 20B and the fixing member 20C.

The first lead 20A and the second lead 20B are used for applying a voltage from an external power supply to electronic parts such as the light-emitting elements 40. The first lead 20A and the second lead 20B can be made of a material having relatively large thermal conductivity. For example, use of a material having thermal conductivity larger than 200 W/(m*k) makes it easy to conduct heat generated in the light-emitting elements 40 to the first lead 20A.

The first lead 20A and the second lead 20B can be made of a material with high strength having processes of punching and cutting easy. A base material is a single layer or a layered body of a metal such as copper, aluminum, tungsten, iron and nickel, these alloys, phosphor bronze or copper-iron alloy. Note that a metal layer can be provided on the entire surface of the first lead 20A and the second lead 20B or be provided partially. The metal layer can be provided only on one of the leads 20A and 20B. Note that the thicknesses and shapes of the first lead 20A and the second lead 20B are set appropriately in the conventional range in the art.

The fixing member 20C is provided: around the first lead 20A; between the second lead 20B and the first lead 20A; and around the one end portion and the other end portion of the second lead 20B, and fix the first lead 20A and second lead 20B. The fixing member 20C is formed, for example, by injecting a forming resin from between the second side 21A2 and the terminal 20B3 and filling the forming resin: around the first lead 20A; between second lead 20B and the first lead 20A; and around the one end portion and the other end portion. As mentioned above, injecting the forming resin from the resin injecting portion makes the forming resin easily filled in the region apart from the resin injecting portion, for example, in between the second lead 20B and the first lead 20A. The element disposal portion 21A of the first lead 20A has an approximately polygon and has oblique sides of a fifth side 21A5, a sixth side 21A6, a seventh side 21A7, and an eighth side 21A8 at the corners. This makes the forming resin easily led around the first lead 20A, between the second lead 20B and the first lead 20A, around one end and the other end of the second lead 20B.

The material of the fixing member 20C is a resin such as an epoxy resin, a silicon resin, a BT resin, a polyamide resin, a polyimide resin, a nylon resin, and an unsaturated polyester resin, and can be a ceramic. The material can contain a colorant, a filler, a reinforcement fiber known in this field. Use of a coloring agent of white filler such as a titanium oxide and a zinc oxide improves a light-extractability of the light-emitting device. Containing a black filler such as a carbon black having a large coefficient of heat emission makes heat conducted from the light-emitting elements 40 efficiently dissipated, and furthermore improves a strength of resin. An example of the filler is silicon oxide or aluminum oxide. An example of the reinforcement fiber is glass, calcium silicate or potassium titanite.

(Au Plating Layer)

As shown in FIGS. 1 to 3 and FIGS. 7A to 7C, the Au plating layer 31 covers at least the upper surface of the first wire bonding portion 22A and the upper surface of the second wire bonding portion and is a plating layer having a primary component of Au. With this construction, the first wire 61 and second wire 62 are joined to the Au plating layer 31 which is not sulfurized by a corrosive gas generated while the light-emitting elements 40 is disposed or the light-emitting device 10A is being driven, and this inhibits sulfurization of the first wire 61 and second wire 62.

The Au plating layer 31 can cover the whole upper surface of the first lead 20A and the whole upper surface of the second lead 20B. In detail, the Au plating layer 31 can cover not only the first wire bonding portion 22A but also the upper surface of the element disposal portion 21A and the upper surface of the terminal portion 23A exposed outside the frame body 50 in the top view, and furthermore the Au plating layer 31 can cover not only the upper surface of the second wire bonding portion 20B2 but also the element disposal portion 20B1 exposed outside the frame body 50 and the upper surface of the terminal portion 20B3 in the top view. This construction improves workability of plating of the Au plating layer 31. As shown in FIGS. 4 and 5, only the Ag plating layer 32 can be disposed on the upper surface of the element disposal portion 21A. Disposing only the Ag plating layer 32, as compare to providing multiple plating layers, improves flatness of the most upper surface, and thus makes the light-emitting elements 40 disposed stably on the base 20. Note that in the element disposal portion 21A, the Au plating layer 31 can be provided on the region not covered by the Ag plating layer 32. This inhibits sulfurization of the matrix material of the first lead 20A. As discussed later, the fourth wire 64 bonding to the protection element 45 is joined to the Au plating layer 31, and this inhibits sulfurization of the fourth wire 64.

The Au plating layer 31 can be not only a single layer of Au but also, in consideration of a cost and a joinability with the base 20, but alternatively a layered body (or laminate) whose most upper surface proximate to the first wire 61 and second wire 62 is composed of an Au layer. For example, the Au plating layer 31 can be an Au layer, a palladium layer, or a nickel layer. Furthermore, the Au layer is a layer disposed proximate to the first wire 61 or the second wire 62 and inhibits sulfurization of the wires. The nickel layer is disposed proximate to the base 20 and reinforces the joint with the base 20. The palladium layer reinforces the joint between the Au layer and the palladium layer. The Au plating layer 31 has a thickness capable of joining the first wire 61 and the second wire 62 and joining with the base 20. The thickness can be from 0.001 μm to 0.1 μm, and furthermore can be from 0.01 μm to 0.1 μm.

(Ag Plating Layer)

As shown in FIGS. 1 to 5, and FIGS. 7A to 7C, the Ag plating layer 32 covers the upper surface of the element disposal portion 21A, and the primary component is Ag. The Ag plating layer 32 covers the upper surface of Au plating layer 31 except the frame-shaped periphery of Au plating layer 31. This construction makes the light from the light-emitting elements 40 reflected by the Ag plating layer 32, and thus improves the light-extractability of the light-emitting device 10A. In the top view, the Ag plating layer 32 is spaced apart inwardly from at least a part of an outer circumference of the end portion of the element disposal portion 21A. Furthermore, in the top view, the Ag plating layer 32 can be spaced apart from the region (the second side 21A2 to the eighth side 21A8, shown in FIG. 6) which contacts with the fixing member 20C in the element disposal portion 21A. With this construction, the end portion of the Ag plating layer 32 is apart from the end portion of the element disposal portion 21A, and thus, sulfurization of the Ag plating layer 32 is inhibited even if a corrosive gas comes in from the gap between the first lead 20A and the fixing member 20C. In detail, in the top view, the Ag plating layer 32 can be apart at 100 μm to 150 μm from the outer circumference of the end portion of the element disposal portion 21A. The contained amount of the Ag plating layer 32 can be 80% mass or more and 100% mass or less in view of improving the light-extractability. Note that as shown in FIG. 7A, in the top view, this construction obtains the effect same as mentioned above as long as the Ag plating layer 32 is apart inwardly from the first side 21A1 to the eighth side 21A8 (see FIG. 6) of the element disposal portion 21A.

The whole outer circumference of the end portion of the Ag plating layer 32 can be covered with the frame body 50. With this construction, the frame body 50 prevents exposing the end portion of the Ag plating layer to the corrosive gas, and thus inhibits sulfurization of Ag plating layer 32.

In the top view, the shape of the Ag plating layer 32 can be a polygon similar to the shape of the Ag plating layer 32 or can be an octagon. In addition, respective sides of the outer circumference of the end portion of the Ag plating layer 32 can be parallel to the corresponding sides of the outer circumference of the end portion of the element disposal portion 21A facing the respective sides. With this construction, the contact area between the Ag plating layer 32 and the frame body 50 is larger than the contact area between the circular Ag plating layer 32 and it. This improves the adhesiveness between the Ag plating layer 32 and the frame body 50 and inhibits separating the Ag plating layer 32 from the frame body 50.

The Ag plating layer 32 is shaped to be apart inwardly from the first side 21A1 to eighth side 21A8 of the element disposal portion 21A. Meanwhile, as shown in FIG. 7B, the region proximate to the first side 21A1 of the element disposal portion 21A in the Ag plating layer 32 can be shaped not to be apart inwardly from the first side 21A1 of the element disposal portion 21A. That is, the Ag plating layer 32 is disposed apart inwardly from at least a part of the outer circumference of the end portion of the element disposal portion 21A. In addition, as shown in FIG. 7C, the region proximate to the first side 21A1 of the element disposal portion 21A in the Ag plating layer 32 can be shaped to extend inside the first wire joint portion 22A (connecting portion 24A) in the range not to overlap with a portion with which the first wire 61 joins. That is, the Ag plating layer 32 is disposed apart inwardly from at least a part of the outer circumference of the end portion of the element disposal portion 21A.

The Ag plating layer and the Au plating layer covered with the frame body can be joined to form a step portion at the end portion of the Ag plating layer and the upper surface of the Au plating layer. This further improves the adhesiveness between the Ag plating layer 32 and the frame body 50 and inhibits separating the Ag plating layer 32 from the frame body 50.

The width W3 (see FIGS. 2 and 3) of the Ag plating layer 32 covered with the frame body 50 can be 10% or more than the width W1 (see FIG. 2) of the bottom portion of the frame body 50 covering the element disposal portion 21A and the first wire bonding portion 22A in view of improving adhesiveness between the Ag plating layer 32 and the frame body 50. The width W3 of the Ag plating layer 32 can be 80% or less relative to the width W1 of the bottom portion of the frame body 50 not to prevent the joint between the first wire 61 and the Au plating layer 31. Note that the width W3 of the Ag plating layer 32 can be, as well as the width W1, from 10% to 80% relative to the width W2 (see FIG. 3) of the bottom portion of the frame body 50 covering the second wire bonding portion 20B2. In addition, the width W3 of the Ag plating layer 32 covered with the frame body 50 does not need to be equal in a circumference direction but can be wider and narrower alternately.

The Ag plating layer 32 can have a thickness for efficiently reflecting the light from the light-emitting elements, also can have a thickness of around 2 nm to 5 μm, further can have a thickness of around 3 μm to 5 μm. In the Ag plating layer 32, the thickness of the end portion can be larger than that of the central portion on which the light-emitting elements 40 are disposed. In other words, the thickness of the central portion on which the light-emitting elements 40 are disposed can be larger than that of the end portion. This makes the light from the light-emitting elements 40 efficiently reflected by the Ag plating layer 32, and thus improves the light-extractability of the light-emitting device 10A. Note that thinner portions of the Ag plating layer 32 tend to be sulfurized. However, in this embodiment, the frame body 50 covers the thinner end portions of the Ag plating layer 32, and this inhibits sulfurization of the Ag plating layer 32.

(Frame Body)

As shown in FIGS. 1 to 5, the frame body 50 has an annular frame body disposed on the upper surface of the base 20 to surround the light-emitting elements 40. The shape of an inner edge or an outer edge of the frame body 50 can be various shapes such as a circle, an ellipse, a polygon such as a quadrangle, a hexagon and an octagon, and a polygon having chamfered corners. The frame body 50 is formed by disposing an uncured raw material to be a base of the frame body 50 on a region where the frame body 50 is to be formed and curing the raw material.

The frame body 50 is disposed such that the frame body 50 covers the end portion of Ag plating layer 32, the first wire bonding portion 22A and the second wire bonding portion 20B2, and can be disposed such that the frame body 50 covers a part of the first wire 61 and a part of the second wire 62. Therefore, the frame body 50 is provided on the boundary between the first lead 20A and the fixing member 20C to cover a connecting portion between them. That is, only the element disposal portion 21A of the first lead 20A can be exposed to the inside of the frame body 50, and the fixing member 20C may not be exposed to the inside the frame body 50. The frame body 50 covering the end portion of the Ag plating layer 32 inhibits sulfurization of the end portion of Ag plating layer 32. The joint between the frame body 50 and the Au plating layer 31 is not strong, and thus providing the Ag plating layer 32, having a strong joint with the frame body 50, within the frame body 50 improves the adhesiveness between the frame body 50; and the Au plating layer 31 and Ag plating layer 32. Furthermore, covering the first wire bonding portion 22A and the second wire bonding portion 20B2 with the frame body 50 decreases a damage on the first wire 61 and the second wire 62 under an external force, and thus inhibits a wire breaking.

The widths W1 and W2 (see FIGS. 2 and 3) of the bottom portion in the cross-sectional view of the frame body 50 is appropriately set such that the element disposal portion 21A of the first lead 20A is disposed inside the frame body 50, and the first lead 20A (the terminal portion 23A), the second lead 20B (the terminal portion 20B3) and a part of the fixing member 20C are disposed outside the frame body 50. Note that the width W2 of a region covering the second wire bonding portion 20B2 as a raw material injecting portion of the frame body 50 can be formed larger than the width W1 of a region including a region covering the first wire bonding portion 22A except the region covering the second wire bonding portion 20B2. Furthermore, the cross-sectional shape of the frame body 50 is not specifically limited but includes various shapes such as a circle including a partial circle, an ellipse including a partial ellipse, and a rectangle, and can have a half ellipse. The frame body 50 includes an inner surface and an outer surface which can be either symmetric or asymmetric to each other in cross-sectional shape. In the case of the asymmetric shape, a slope on the outer surface of the frame body 50 can be gentler than a slope on the inner surface of the frame body 50.

A material forming the frame body 50 can have a higher gas barrier property, and, for example, is a resin, a ceramic, or a metal with insulated coating on a surface. An example of the resin material is a phenol resin, an epoxy resin, a BT resin, a PPA or a silicon resin, and can be a phenyl silicon resin. This material further inhibits wire breaking of the first wire 61 and the second wire 62 and sulfurization of the Ag plating layer 32.

The frame body 50 includes a matrix resin, and powders of a reflecting member are dispersed in the matrix resin. The reflecting member is difficult to absorb light from the light-emitting elements 40 and has a large refractive index difference from the matrix resin. Therefore, the frame body 50 efficiently reflects the light from the light-emitting elements 40. An example of the reflecting member is a titanium oxide, an aluminum oxide, a zirconium oxide or a magnesium oxide. Particularly, a titanium oxide is excellent due to its stability to moisture and a higher refractive index. The frame body 50 is has a reflectance of 60% or more to the light from the light-emitting elements 40 and can have a reflectance of 90% or more. A filler content of the reflecting member such as a titanium oxide is appropriately chosen according to a formation condition of a resin fluidity. For example, the filler content of the titanium oxide can be 20 to 60 wt %, and further can be 25 to 35 wt %. This makes it difficult for the light come to the frame body 50 to be absorbed by the frame body 50, and thus improves the light-extractability of the light-emitting device 10A.

The light-emitting device 10A according to the first embodiment, as shown in FIG. 1, can include a protection element 45. The protection element 45 is disposed on the upper surface of the element disposal portion 20B1 of the second lead 20B with the intervening the Au plating layer 31. Electrically connecting the fourth wire 64 joined on the protection element 45 to the Au plating layer 31 of the element disposal portion 21A (the first lead 20A) inhibits sulfurization of the fourth wire 64. Note that a disposing position of the protection element 45 is not limited to the description mentioned above but can be disposed on the element disposal portion 21A of the first lead 20A. The whole or a part of the protection element 45 can be covered with the frame body 50. The fourth wire 64 can be covered with the frame body 50 for reducing a damage on the fourth wire under an external force and for inhibiting wire breaking. The protection element 45, for example, operates such that when a reverse voltage is applied to the light-emitting elements 40, the protection element 45 prevents a current from flowing in a reverse direction, or when a forward voltage higher than an operating voltage is applied to the light-emitting elements 40, the protection element 45 prevents an overcurrent from flowing through the light-emitting elements 40. An example of the protection element 45 is a protection circuit or an electrostatic protection element, and, in detail, employs a Zener diode.

<Method of Manufacturing for the Light-Emitting Device>

Figure 9:
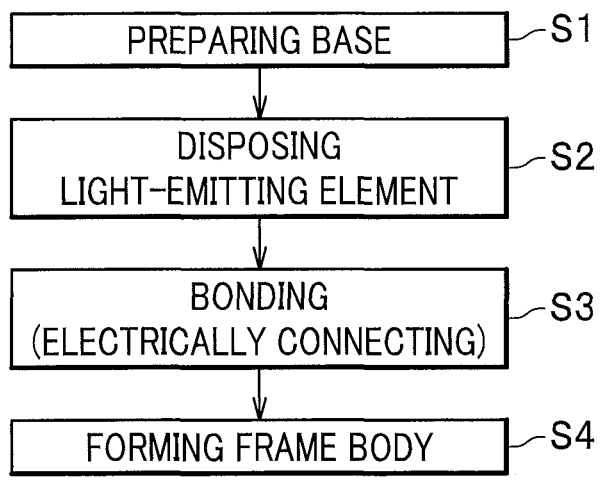
FIG. 9 is a flowchart showing the flow of the method for manufacturing the light-emitting device according to the first embodiment.
Figure 10A:
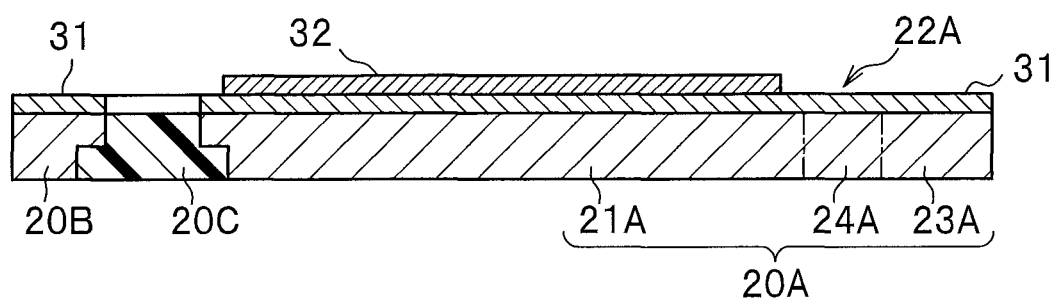
FIG. 10A is a cross-sectional view taken along the XA-XA of FIG. 7A, and schematically shows the base provided with an Au plating layer and the Ag plating layer in a process of preparing the base of the method for manufacturing the light-emitting device according to the first embodiment.
Figure 10B:
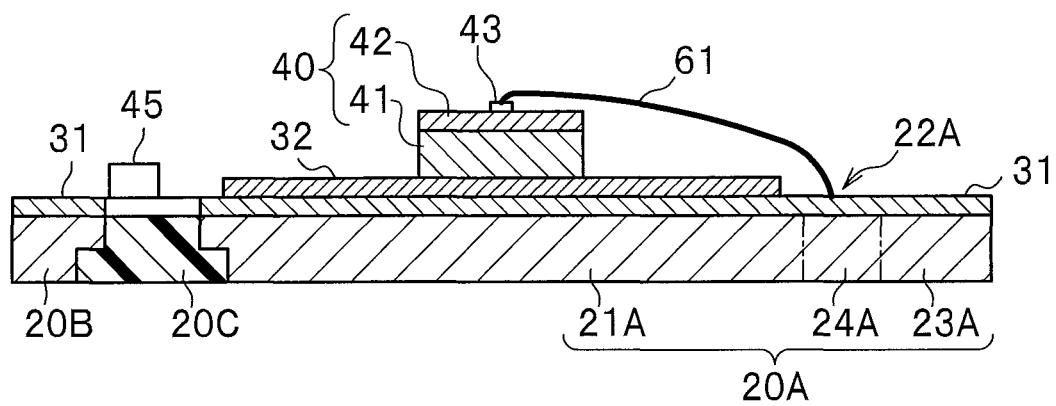
FIG. 10B is a cross-sectional view taken along the XB-XB of FIG. 8A, and schematically shows the light-emitting elements being disposed on the base, and the base bonding the first wire and the second wire in a bonding process in the method for manufacturing a light-emitting device according to the first embodiment.

Next, a method of manufacturing for the light-emitting device according to the first embodiment will be described. FIG. 9 is the flowchart showing the flow for the method of manufacturing for the light-emitting device according to the first embodiment. FIG. 10A is the cross-sectional view taken along XA-XA, and is the cross-sectional view schematically showing the base where the Au plating layer and the Ag plating layer are provided in a preparation process of the method for manufacturing a light-emitting device according to the first embodiment. FIG. 10B is the cross-sectional view taken along XB-XB, and is the cross-sectional view schematically showing the base where the light-emitting elements are disposed in a disposing process, and the first wire and the second wire are joined in a bonding process in the method for manufacturing the light-emitting device according to the first embodiment. Note that the construction of the light-emitting device 10A will be described appropriately with referring to FIGS. 1 to 8A.

As shown in FIG. 1, FIG. 9, FIG. 10A and FIG. 10B, the method of manufacturing for the light-emitting device 10A includes a process S1 of preparing a base, a process S2 of disposing a light-emitting element, a process S3 of bonding (electrically connecting), and a process S4 of forming a frame body. In the process S1, a base 20 is provided that includes an element disposal portion 21A at which the light-emitting elements 40 is to be disposed, a first lead 20A having a first wire bonding portion 22A, a second lead 20B having a second wire bonding portion 20B2, and a fixing member 20C to fix the first lead 20A and the second lead 20B. The process S1 includes preparing the base 20 as follows. At least the Au plating layer 31 having a primary component of Au is disposed on the upper surface of the first wire bonding portion 22A and on the upper surface of the second wire bonding portion 20B2. In the top view, the Ag plating layer 32 having a primary component of Ag is disposed on the element disposal portion 21A and apart inwardly from at least a part of the outer circumference of the end portion of the element disposal portion 21A. The process S2 includes disposing the light-emitting elements 40 on the upper surface of the element disposal portion 21A. The process S3 includes electrically connecting the light-emitting elements 40 to the first wire bonding portion 22A with the first wire 61, and also connecting the light-emitting elements 40 to the second wire bonding portion 20B2 with the second wire 62. The process S4 includes providing the frame body 50 on the upper surface of the base 20 so as to surround the light-emitting element 40 and to cover the end portion of the Ag plating layer 32, the first wire bonding portion 22A and the second wire bonding portion 20B2. Hereinafter, each process will be described.

(Process S1)

As shown in FIG. 10A, the process S1 includes: a first sub-process of preparing the base 20 having the first lead 20A, the second lead 20B and the fixing member 20C fixing the first lead 20A and second lead 20B; and a second sub-process of providing the Au plating layer 31 and the Ag plating layer 32 on the predetermined region of the base 20. Note that, as shown in FIG. 6, the first lead 20A can include not only the element disposal portion 21A on which the light-emitting elements 40 are disposed, and the connecting portion 24A with the first wire bonding portion 22A but also the terminal portion 23A. The second lead 20B can include not only the second wire bonding portion 20B2 but also the element disposal portion 20B1 and the terminal portion 20B3.

The first sub-process includes preparing the base 20 with conventional methods. For example, the base 20 can be prepared by an injection forming. In the injection forming, the first lead and the second lead are disposed apart from each other in the molding die to form a space portion between the first lead 20A and the second lead 20B. Next, the uncured fixing member 20C is injected into the space portion from the injection port of the molding die, and the uncured fixing member 20C is cured. This process results in preparation of the base 20 in which the first lead 20A and the second lead 20B are fixed each other with the fixing member 20C.

The second sub-process includes plating of the base 20 with conventional methods of plating. The second sub-process can include plating after masking on a region which does not need plating such as the fixing member 20C. As shown in FIGS. 7A to 7C, the Au plating layer 31 can be provided not only on the upper surface of the first wire bonding portion 22A and the upper surface of the second wire bonding portion 20B2 but also on each upper surface of: the element disposal portion 21A of the first lead 20A; the terminal portion 23A; the element disposal portion 20B1 of the second lead 20B; and the terminal portion 20B3. Note that the Au plating layer 31 can be provided on the whole surface of the element disposal portion 21A, meanwhile be provided in a frame shape except the region of Ag plating layer 32. The Ag plating layer 32 is provided on the upper surface of the Au plating layer 31 provided on the upper surface of the element disposal portion 21A. In addition, in the top view, the Ag plating layer 32 is provided such that the Au plating layer 31 is apart inwardly from the outer circumference of the end portion of the element disposal portion 21A and exposed in a frame shape. Note that the Ag plating layer 32 can be provided inside the Au plating layer 31 provided in a frame shape. As long as the Au plating layer 31 and the Ag plating layer 32 reflect the light from the light-emitting elements 40, they are not limited to a plating layer, and can be an Au contained layer or an Ag contained layer disposed by using an evaporation method, a sputtering method or an ion beam assisted evaporation method.

(Process S2)

As shown in FIGS. 8A and 10B, the process S2 includes disposing the light-emitting element 40 on the upper surface of the element disposal portion 21A. The process S2 includes joining the lower surface of the element substrate 41 of the light-emitting elements 40 and the upper surface of the Ag plating layer 32 together by using a conventional method and a bonding member. The process S2 can include disposing the protection element 45 on the upper surface of the element disposal portion 20B1.

(Process S3)

As shown in FIGS. 8A and 10B, the process S3 includes electrically connecting the light-emitting elements 40 and the first wire bonding portion 22A provided on the connecting portion 24A together with the first wire 61, and electrically connecting the light-emitting elements 40 and the second wire bonding portion 20B2 with the second wire 62. The process S3 includes connecting the first wire 61 and the second wire 62 to the Au plating layers 31 of the upper surfaces of the first wire bonding portion 22A and the second wire bonding portion 20B2 respectively. The process S3 includes wire joining with conventional methods of, for example, a bowl bonding, a wedge bonding. Note that in the process S3, when two or more light-emitting elements 40 are disposed in the process S2, connection between the light-emitting elements are simultaneously performed with the fourth wire. The process S3 can perform electrically connecting the protection element 45 and the element disposal portion 21A by using the fourth wire 64. Note that, as shown in FIG. 8B, the process S3 can include electrically connecting the light-emitting elements 40 and the first wire bonding portion 22A provided at the outer circumference of the end portion of the element disposal portion 21A by using the first wire 61.

(Process S4)

As shown in FIG. 1, the process S4 includes providing the frame body 50 on the upper surface of the base 20 so as to surround the light-emitting elements 40, and to cover the end portion of the Ag plating layer 32, the first wire bonding portion 22A and the second wire bonding portion 20B2. In the process S4, the frame body 50 can cover a whole end portion along the end portion of the Ag plating layer 32. In the process S4, the frame body 50 is provided with conventional methods. For example, when the frame body 50 is made of a resin, the uncured matrix resin of the frame body 50 is injected into the predetermined region of the upper surface of the base 20, then disposed, and cured.

Second Embodiment

<Construction of Light-Emitting Device>

Figure 11:
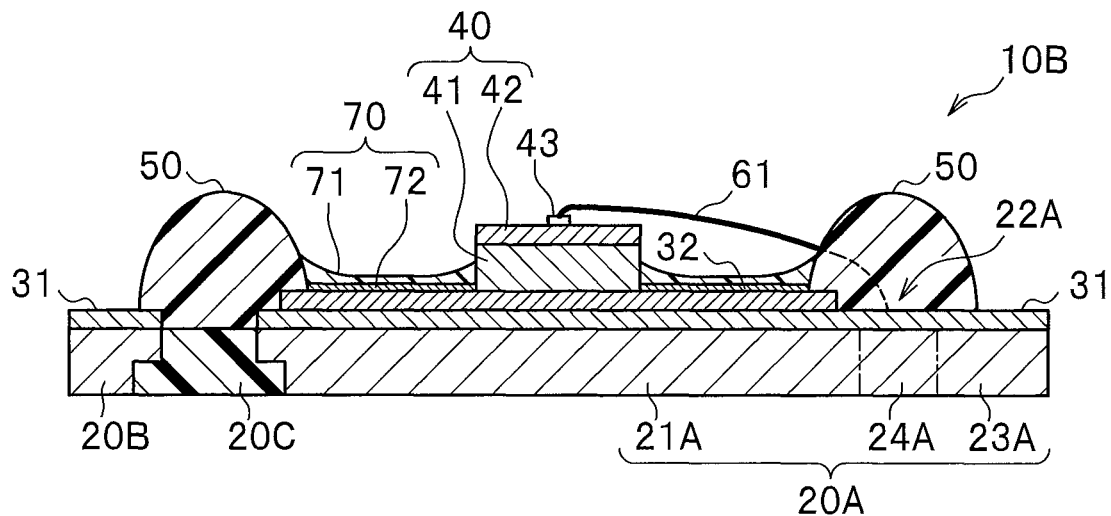
FIG. 11 is a cross-sectional view corresponding to FIG. 2 schematically showing the construction of the light-emitting device in the second embodiment.

First, the light-emitting device will be described according to the second embodiment. FIG. 11 is the cross-sectional view schematically showing the construction of the light-emitting device according to the second embodiment. Note that as to the same features as those of the light-emitting device according to the first embodiment, the same reference numerals are used, and the descriptions are omitted.

As shown in FIG. 11, the light-emitting device 10B includes a reflecting member 70 containing a reflecting material in addition to the same features as the light-emitting device 10A. The reflecting member 70 includes the lower layer 72 where the reflecting material is deposited and an upper layer 71 of a resin which does not contain the reflecting material.

(Reflecting Member)

The reflecting member 70 is provided inside the frame body 50, that is the region surrounded by the frame body 50. The reflecting member 70 is a resin layer containing a reflecting material and covers a part of the side surface of the light-emitting elements 40, a part of the inside surface of the frame body 50 and the upper surface of the Ag plating layer 32. The reflecting member 70 covers a part of the side surface of the light-emitting elements 40 but does not cover the whole side surface. This construction does not block the light emitted sideward from the light-emitting elements 40, and thus improves the light-extractability of the light-emitting device 10B. Covering a part of the side surface of the frame body 50 with the reflecting member 70 improves the adhesiveness between the reflecting member 70 and the frame body 50. The reflecting member 70 covers the upper surface of the Ag plating member 32 and reflects the light from the light-emitting elements 40 if the Ag plating layer 32 is deteriorated by sulfurization, and thus inhibits deterioration of the light-extractability.

The reflecting member 70 has the lower layer 72 containing a reflecting material and has the upper layer 71 which does not contain the reflecting material provided on the upper surface of the lower layer 72, that is, formed of only the matrix resin which is the matrix of the reflecting member 70. Note that the lower layer 72 is formed by deposition of the reflecting material in the upper layer 71, and an interface between the upper layer 71 and the lower layer 72 does not exist. Therefore, the reflecting member 70 is not made of two members which are the upper layer 71 and the lower layer 72.

The reflecting material of the lower layer 72 is disposed to cover the upper surface of the Ag plating layer 32. With this construction, the joint between the reflecting member 70 and the Ag plating layer 32 is the joint between the reflecting material made of a pigment and the Ag plating layer 32 made of a metal material, and thus improves the adhesiveness between the reflecting member 70 and the Ag plating layer 32.

The upper surface of the upper layer 71, in the cross-sectional view, can have a flat region and an oblique region having a height from the upper surface of the base 20 which is higher as it extends to the inside surface of the frame body 50. The whole side surface proximate to the frame body 50 of the upper layer 71 can contact with the inside surface of the frame body 50. The upper surface of the upper layer 71, in the cross-sectional view, can have the oblique region having a height from the upper surface of the base 20 which is higher as the upper layer 71 extends to the side surface of the light-emitting elements 40.

The reflecting member 70 has an oblique region where the upper surface of the upper layer 71 is sloped toward the frame body 50, and the whole side surface of the upper layer 71 proximate to the frame body 50 contacts with the inside surface of the frame body 50. This oblique region increases a contact area between the frame body 50 and the upper layer 71, and thus improves the adhesiveness between the frame body 50 and the reflecting member 70. The reflecting member 70 has an oblique region where the upper surface of the upper layer 71 is sloped toward the light-emitting elements 40. This oblique region increases a contact area between the light-emitting elements 40 and the upper layer 71, and thus improves the adhesiveness between the light-emitting elements 40 and the reflection member 70. The oblique regions of the frame body 50 and the light-emitting elements 40 can be formed in a curved shape. The oblique regions in a curved shape eliminate a portion where stress is concentrated, and thus further improve the adhesiveness. The height of the oblique region of the frame body 50 can be larger than that of the light-emitting elements 40. The oblique region can have a slope from 30 degree to 60 degree. This construction further improves the adhesiveness of the reflecting member 70. Furthermore, the light-emitting elements 40 can have an oblique region where the height from the base 20 is lower than that of the lower surface of the semiconductor layer 42 (the light-emitting elements 40). Therefore, the light emitted sideward from the light-emitting elements 40 is not blocked by the reflecting member 70, and thus further improves the light-extractability of the light-emitting device 10B.

The upper surface of the lower layer 72 can be flat in the cross-sectional view. That is, the upper surface of the lower layer 72 can have a constant thickness along the upper surface of the Ag plating layer 32. This construction decreases an area where the lower layer 72 containing the reflecting material which has poor adhesiveness with the frame body 50 made of a resin contacts with the frame body 50, and thus increases the area where the upper layer 71 made of a resin not containing the reflecting material contacts with the frame body 50. This improves the adhesiveness between the reflecting member 70 and the frame body 50.

The reflecting member 70 is a resin layer containing a reflecting material in a matrix resin. An example of a matrix resin is a phenol resin, an epoxy resin, a BT resin, a PPA or a silicon resin. Particularly, the matrix resin can be a silicon resin having an excellent light resistance. The matrix resin to be the matrix of the reflecting member 70 can be the same material as the matrix resin of the frame body 50. This structure improves the adhesiveness between the frame body 50 and the reflecting member 70.

The matrix resin of the reflecting member 70 contains a powder of the reflecting material which is difficult to absorb the light from the light-emitting elements 40, furthermore has a large difference in the refractive index from the matrix resin, and thus efficiently reflects the light from the light-emitting elements 40. An example of a reflecting member is a titanium oxide, an aluminum oxide, a zirconium oxide or a magnesium oxide. Particularly, a titanium oxide can be used due to stability against moisture and a higher refractive index. The reflecting material has a reflectance of 60% or more for the light from the light-emitting elements 40 and can have a reflectance of 90% or more. This structure makes it difficult for the light having come to the reflecting member 70 to be absorbed by the reflecting member 70, and thus improves the light-extractability of the light-emitting device 10B.

<Method of Manufacturing for the Light-Emitting Device>

Figure 12:
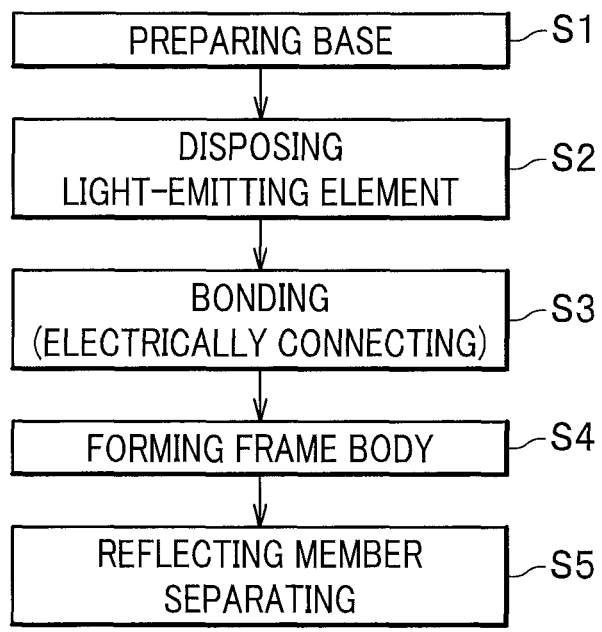
FIG. 12 is a flowchart showing the flow of the method for manufacturing the light-emitting device according to the second embodiment.

Next, the method of manufacturing for the light-emitting device according to the second embodiment will be described. FIG. 12 is the flowchart showing the flow for the method of manufacturing for the light-emitting device according to the second embodiment. Note that as to the same construction as the light-emitting device according to the first embodiment, the same reference numerals are used, and the descriptions are omitted.

As shown in FIG. 12, the method of manufacturing for the light-emitting device 10B includes a process S5 of reflecting member separating after the process S4 in addition to the same processes as the method of manufacturing for the light-emitting device 10A (see FIG. 9).

(Process S5)

The process S5 includes injecting a reflecting member 70 made of a reflecting material and a resin into the inside of the frame body 50, applying centrifugal force generated by revolution to the base 20, and separating the reflecting member 70 into the lower layer 72 containing a reflecting material and the upper layer 71 not containing a reflecting material.

The process S5 can include injecting the uncured matrix resin to be the matrix of the reflecting member 70 into the inside of the frame body 50 by potting or spraying, then the resin can be cured. When the uncured matrix resin is injected into the inside of the frame body 50, the process S5 can include disposing a resin applying nozzle just above the frame body 50 and can include injecting the uncured matrix resin flowingly into the upper surface of Ag plating layer 32 and the side surface of the light-emitting elements 40 along the inside surface of the frame body 50. Thus, when the matrix resin is injected from the side proximate to the frame body 50, a difference in wettability between the matrix resin for the Ag plating layer 32; the inside surface of the frame body 50; and side surface of the light-emitting elements 40 makes the matrix resin move up along the inside surface of the frame body 50 and the side surface of the light-emitting elements 40. As a result, the reflecting member 70 is formed on the upper surface with curved oblique regions at the both sides of the flat region, that is, the side proximate to the frame body 50 and the side proximate to the light-emitting elements 40. In addition, soaking the inside surface of the frame body in an organic medium beforehand promotes the moving up at the oblique regions. Note that the uncured matrix resin can be injected from the center of the upper surface of the Ag plating layer 32.

The process S5 includes rotating the base 20 in the direction of revolution with a rotation axis above the upper surface of the base 20 and applying the centrifugal force with the rotation axis that is outside the base 20. The rotation axis on the upper side of the base 20: is parallel to the upper surface of the base 20; has a direction across the frame body 50; and is located above the base 20. Rotation of base 20 in the revolution direction makes the reflecting material contained in the reflecting member 70 be forced to deposit on the upper surface of the Ag plating layer 32. That is, the lower layer 72 containing the reflecting material is disposed to cover the upper surface of the Ag plating layer 32 in a layered shape. The shape of the upper surface of the lower layer 72 is adjustable by a magnitude of the centrifugal force determined by a rotation speed. The upper surface of the lower layer 72 can be flat. Note that the process S5 can include rotating the base 20 in the self-rotation direction after the rotation in the revolution direction with the rotation axis which is at the center in the length direction of the base 20 and extends in the vertical direction to the length direction. This rotation in the self-rotation direction makes the height of the oblique region of the upper layer 71 from the base 20 larger. The moving up at the oblique regions also occurs while the reflecting member 70 is cured.

Third Embodiment

<Construction of Light-Emitting Device>

Figure 13:
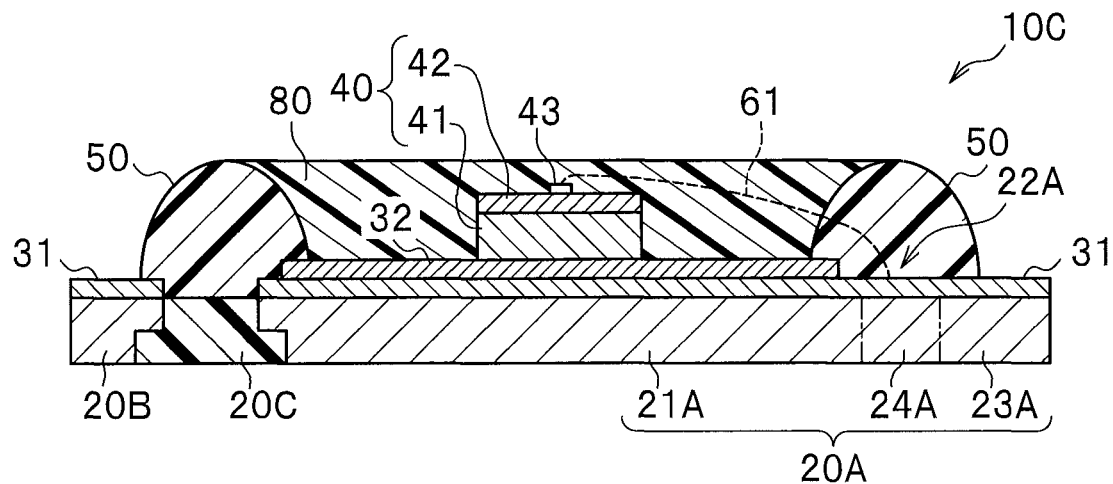
FIG. 13 is a cross-sectional view corresponding to FIG. 2 schematically showing the construction of the light-emitting device in the third embodiment.

First, the light-emitting device will be described according to the third embodiment. FIG. 13 is the cross-sectional view schematically showing a construction of a light-emitting device according to a third embodiment. Note that as to the same construction as the light-emitting device according to the first embodiment, the same reference numerals are used, and the descriptions are omitted.

As shown in FIG. 13, the light-emitting device 10C includes the phosphor member 80 in addition to the same construction as the light-emitting device 10A. The light-emitting device 10C can further include the phosphor member 80 in addition to the same construction as the light-emitting device 10B. The phosphor member 80 inhibits dust from entering the light-emitting device 10A from the outside, protects the first wire 61 to the fourth wire 64, and thus improves reliability. The phosphor member 80 containing the phosphor converts wavelengths of light emitted from the light-emitting elements 40, and thus adjusts a tone of color of the extracted light.

(Phosphor Member)

The phosphor member 80 is a member: provided inside the frame body 50; containing the phosphor covering the upper surface of the light-emitting elements 40 and the upper surface of the Ag plating layer 32; and sealing the light-emitting elements 40 into the inside of the frame body 50. As shown in FIG. 13, in the cross-sectional view, the phosphor member 80 can be provided such that the heights from the base 20 are uniformly constant and the phosphor member 80 contacts with the inside surface of the frame body 50. Meanwhile the phosphor member 80 can be curved upwardly at the center with the portion right above the light-emitting element 40 being higher and contact with the inside surface of the frame body 50. Also, the phosphor member 80 can be curved downwardly at the center with the portion right above the light-emitting element being lower and contact with the inside surface of the frame body 50. Note that the light-emitting device 10D (see FIG. 15) including the lens member 90 obtains an effect of inhibition of the reflecting light generated on the interface between the phosphor member 80 and lens member 90.

An example of a material forming the phosphor member 80 is a resin or glass having light-transmittivity and containing a phosphor material. Particularly, a resin can be used for the phosphor member 80. In case that each matrix material of the frame body 50 is a resin, using a resin for the phosphor member 80 improves the adhesiveness between the phosphor material 80 and the frame body 50. An example of a material for the phosphor member 80 is a polycarbonate resin, an epoxy resin, a phenol resin, a silicon resin, an acrylic resin, a polymethyl pentene resin, a polynorbornene resin, modified resins of these resins, or a hybrid resin including more than one of the above resins. Particularly, an example of material for the phosphor member 80 can be a dimethyl silicon resin or a phenyl silicon resin, which have an excellent light resistance. The phosphor member 80 can contain a light diffusing agent.

The phosphor employs phosphor particles which are excited by the light emission from the light-emitting elements 40 and can convert the wavelengths of the light from the light-emitting elements 40. An example of the phosphor excited by a blue light emitting element or an ultraviolet radiation emitting element is a yttrium aluminum garnet phosphor (YAG: Ce) activated by cerium, a lutetium aluminum garnet phosphor (LAG: Ce) activated by cerium, nitrogen-containing calcium aluminosilicate phosphor (CaO—$Al_2O_3$—$SiO_2$: Eu, Cr) activated by europium and/or chromium, a silicate phosphor ((Sr, Ba)$_2$SiO$_4$: Eu) activated by europium, a β-sialon phosphor, a CASN phosphor, a nitride phosphor such as SCASN phosphor, a fluoride phosphor such as KSF phosphor, a sulfide phosphor, a chloride phosphor, a silicate phosphor, a phosphate phosphor, or a quantum dot phosphor. Combination of the above phosphors with a blue light emitting element or an ultraviolet radiation emitting element allows the light-emitting device 10C generating light with a variety of wavelengths to be manufactured.

An example of a material for the light diffusing agent is a titanium oxide, a zirconium oxide, an aluminum oxide or a silicon oxide. Particularly, the titanium oxide can be used due to its relative stability against the moisture and its higher refractive index.

<Method of Manufacturing for the Light Emitting Device>

Figure 14:
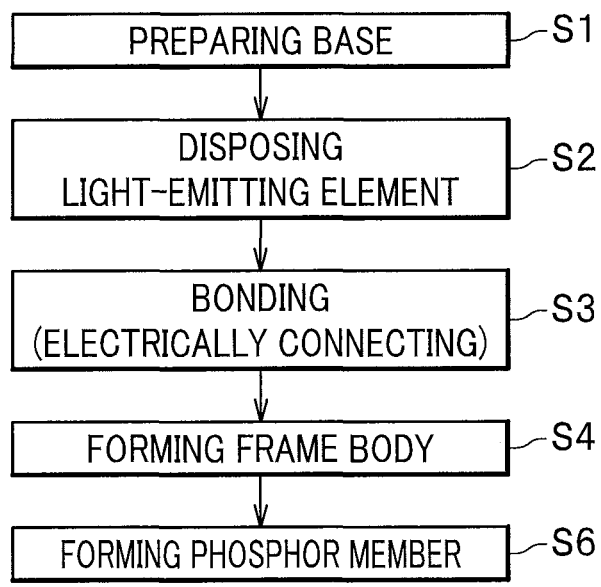
FIG. 14 is a flowchart showing the flow of the method for manufacturing the light-emitting device according to the third embodiment.

Next, the method of manufacturing for the light-emitting device according to the third embodiment will be described. FIG. 14 is the flowchart showing the flow for the method of manufacturing for the light-emitting device according to the third embodiment. Note that as to the same construction as the light-emitting device according to the first embodiment, the same reference numerals are used, and the descriptions are omitted.

As shown in FIG. 14, the method of manufacturing for the light-emitting device 10C includes a process S6 of forming a phosphor member after the process S4 in addition to the same processes as the method of manufacturing for the light-emitting device 10A (see FIG. 9). The method of manufacturing for the light-emitting device 10C can include the process S6 after the process S5 in addition to the same processes as the method of manufacturing for the light-emitting device 10B (see FIG. 12). The method of manufacturing for the light-emitting device 10C includes the process S6, and thus improves reliability of the light-emitting device 10C and the tone of color of an extracted light.

(Process S6)

The process S6 includes filling the phosphor member 80 containing the phosphor inside the frame body 50. A method of filling the phosphor member 80 uses conventional methods such as potting or spraying. The phosphor member 80 can be formed with a uniform height from the base 20. Meanwhile the phosphor member 80 can be curved upward at the center with the portion right above the light-emitting element being higher or be curved downward at the center.

Fourth Embodiment

<Construction of Light-Emitting Device>

Figure 15:
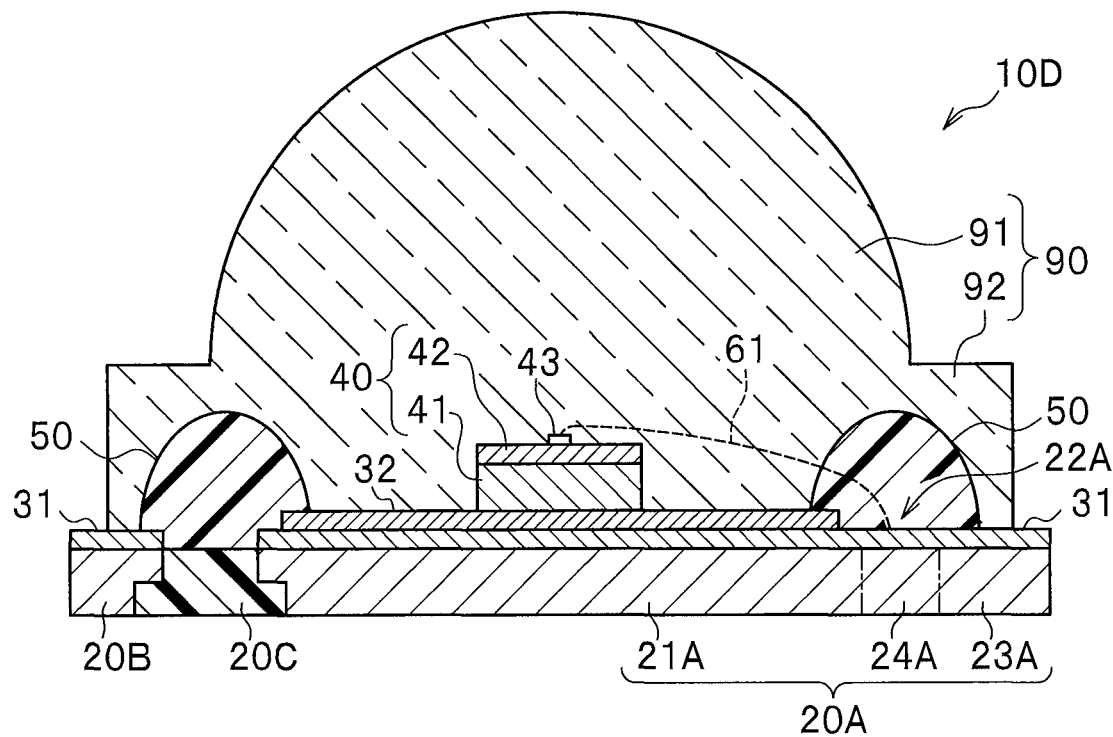
FIG. 15 is a cross-sectional view corresponding to FIG. 2 schematically showing the construction of the light-emitting device in the fourth embodiment.

First, the light-emitting device will be described according to the fourth embodiment. FIG. 15 is the cross-sectional view schematically showing the construction of the light-emitting device according to the fourth embodiment. Note that as to the same construction as the light-emitting device according to the first embodiment, the same reference numerals are used, and the descriptions are omitted.

As shown in FIG. 15, the light-emitting device 10D includes the lens member 90 having a lens function in addition to the same construction as the light-emitting device 10A. The light-emitting device 10D can include the lens member 90 having the lens function in addition to the same construction as the light-emitting device 10B or the light-emitting device 10C.

(Lens Member) As shown in FIG. 15, the lens member 90 is the member covering at least a part of the frame body 50 and the light-emitting elements 40 and having the lens function. The lens member 90 improves the light-extractability and the light-orientation. The lens member 90 covers even the outside of the frame member 50, and thus increases a contact area and prevents the lens member 90 from being peeled off. At the outside of the frame body 50, the lens member 90 is formed to cover at least parts of the respective first lead 20A and second lead 20B of the base 20. This construction further inhibits the lens member 90 from being peeled off. Note that providing not the Ag plating layer 32 but the Au plating layer 31 on the terminal portion 23A of the first lead 20A and the terminal portion 20B3 of the second lead 20B prevents performance of the light-emitting device 10D from being deteriorated due to sulfurization.

The lens member 90 can have various shapes. An example of a shape of the lens member 90 is a plate, a convex upper surface, a concave upper surface, a Fresnel lens, or a convex lens having a concave portion around a center. These shapes adjust the directional characteristics of the extracted light from the lens member 90.

The lens member 90 having an upper surface in a convex lens can include the lens portion 91 having an emission surface in a convex curved shape provided above the light-emitting elements 40, and a flange portion 92 extending from the lower portion of the lens portion 91 to the outside so as to be placed above the frame body 50. The lens member 90 has the flange portion 92, and thus reflects the light emitted from the light-emitting elements on an upper and a side surface of the flange portion 92. This diffuses the light widely, and thus improves the light-orientation.

The lens member 90 is composed with a light-transmissive material having a capability of extractability. An example of a transparent material composing the lens member 90 is a resin such as a silicon resin, an epoxy resin and glass. The lens member 90 can have any size as long as the lens member 90 covers the light-emitting elements and at least a part of the frame body 50, and the size is appropriately determined in consideration for the emitting area of the light-emitting elements 40. The refractive index of the lens member 90 has any value if the difference between the refractive index of the lens member 90 and that of air is in an appropriate range. The refractive index of the lens member 90 can have a range from around 1.4 to 1.6. Such a range of the refractive index of the lens member 90 improves the light-extractability.

<Method of Manufacturing for the Light Emitting Device>

Figure 16:
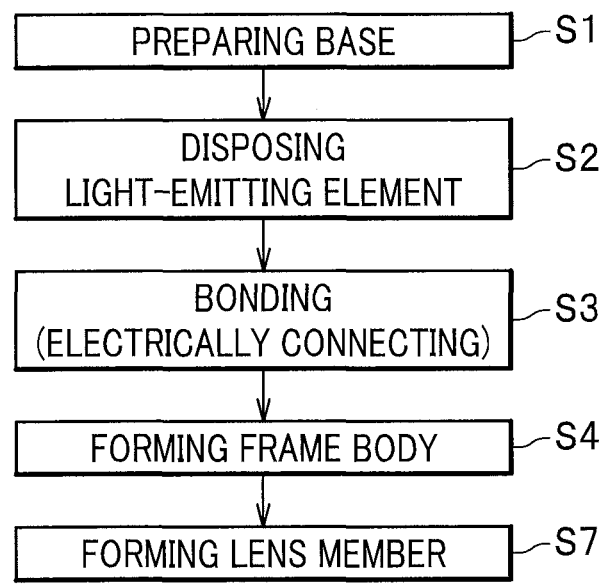
FIG. 16 is a flowchart showing the flow of the method for manufacturing the light-emitting device according to the fourth embodiment.

Next, the method of manufacturing for the light-emitting device according to the fourth embodiment will be described. FIG. 16 is the flowchart showing the flow for the method of manufacturing for the light-emitting device according to the fourth embodiment. Note that as to the same construction as the light-emitting device according to the first embodiment, the same reference numerals are used, and the descriptions are omitted.

As shown in FIG. 16, the method of manufacturing for the light-emitting device 10D includes a process S7 of forming a lens member after the process S4 in addition to the same processes as the method of manufacturing for the light-emitting device 10A (see FIG. 9). The method of manufacturing for the light-emitting device 10D can include the process S7 after the process S5 in addition to the same processes as the method of manufacturing for the light-emitting device 10B (see FIG. 12). The method of manufacturing for the light-emitting device 10D can include the process S7 after the process S6 in addition to the same processes as the method of manufacturing for the light-emitting device 10C (see FIG. 14).

(Process S7)

As shown in FIG. 15, the process S7 includes providing the lens member 90 covering at least a part of the frame body 50 and the light-emitting elements 40. In addition, in the process S7, the lens member 90 can be provided to cover at least parts of the respective first lead 20A and the second lead 20B at the outside of the frame body 50.

The process S7 can perform providing the lens member 90 with conventional methods such as a transfer molding. The transfer molding performs disposing the light-emitting device 10A so as to cover the light-emitting elements 40 and the upper surface of the frame body 50 in the molding die having a cavity portion in a shape which corresponds to a shape of the lens member 90, for example, shapes of the lens portion 91 and flange portion 92. In this condition, the end portion of the cavity portion corresponding to the lens portion 91 is disposed outside the frame body 50, and the frame body 50 may not contact with the surface of the cavity portion. The lens member 90 in uncured condition is injected into the cavity portion, and then cured. This process provides the lens member 90 covering the light-emitting elements 40 and the frame body 50 on the upper surface of the base 20. Note that the lens member 90 can be provided to cover at lease parts of the respective first lead 20A and second lead 20B, which are exposed outside of the frame body 50.

In the embodiments mentioned above, the embodiments for carrying out the invention have been specifically described. It should be noted, however, that the spirit of the present invention is not limited thereto and should be construed broadly based on the scope of claims. It goes without saying that the spirit of the present invention includes also variations and modifications based on the foregoing descriptions.

What is claimed is:

1. A light-emitting device comprising:
   a light-emitting element;
   a base including: a first lead including an element disposal portion on which the light-emitting element is disposed and a first wire bonding portion flush with the element disposal portion; a second lead including a second wire bonding portion; and a fixing member fixing the first lead and the second lead together;
   a frame body provided on an upper surface of the base to surround the light-emitting element;
   an Ag plating layer containing a primary component of Ag and covering an upper surface of the element disposal portion;
   an Au plating layer containing a primary component of Au and covering at least an upper surface of the first wire bonding portion and at least an upper surface of the second wire bonding portion;
   a first wire electrically connecting the light-emitting element and the first wire bonding portion; and
   a second wire electrically connecting the light-emitting element and the second wire bonding portion, wherein the Ag plating layer is disposed apart inwardly from at least a part of an outer circumference of an end portion of the element disposal portion in a top view, wherein the frame body is provided at such a position that the frame body covers an end portion of the Ag plating layer, the first wire bonding portion, and the second wire bonding portion, and wherein the Ag plating layer and the Au plating layer covered with the frame body are joined together with a step portion formed, along all edges of the frame body, between the end portion of the Ag plating layer and an upper surface of the Au plating layer in a cross-sectional view.

2. A light-emitting device comprising:

a light-emitting element;

a base including: a first lead including an element disposal portion on which the light-emitting element is disposed and a first wire bonding portion flush with the element disposal portion; a second lead including a second wire bonding portion; and a fixing member fixing the first lead and the second lead together;

a frame body provided on an upper surface of the base to surround the light-emitting element;

an Ag plating layer containing a primary component of Ag and covering an upper surface of the element disposal portion;

an Au plating layer containing a primary component of Au and covering at least an upper surface of the first wire bonding portion and at least an upper surface of the second wire bonding portion;

a first wire electrically connecting the light-emitting element and the first wire bonding portion; and a second wire electrically connecting the light-emitting element and the second wire bonding portion, wherein the Ag plating layer is disposed apart inwardly from at least a part of an outer circumference of an end portion of the element disposal portion in a top view, wherein the frame body is provided at such a position that the frame body covers an end portion of the Ag plating layer, the first wire bonding portion, and the second wire bonding portion, wherein the Ag plating layer includes a central portion on which light-emitting element is disposed, and wherein the end portion of the Ag plating layer has a smaller thickness than the central portion of the Ag plating layer.

3. The light-emitting device according to claim 1, wherein the frame body covers a whole circumference of the end portion of the Ag plating layer.

4. The light-emitting device according to claim 1, wherein the frame body covers a part of the first wire and a part of the second wire.

5. The light-emitting device according to claim 1, wherein the element disposal portion includes an octagonal portion and the Ag plating layer has an octagon similar in shape to the octagonal portion in a top view.

6. The light-emitting device according to claim 1, wherein the element disposal portion includes a region which is not covered with the Ag plating layer and which is covered with the Au plating layer.

7. The light-emitting device according to claim 1, wherein a width of the Ag plating layer covered with the frame body is 10% to 80% relative to a width of a bottom portion of the frame body in a cross-sectional view.

8. The light-emitting device according to claim 1, wherein the Au plating layer covers respective upper surfaces of the first lead and the second lead which are exposed outside the frame body in the top view.

9. The light-emitting device according to claim 1, further comprising a reflecting member containing a reflecting material, wherein the reflecting member is provided inside the frame body, wherein the reflecting member covers a part of a side surface of the light-emitting element, a part of an inside surface of the frame body and an upper surface of the Ag plating layer, and wherein the reflecting member comprises a lower layer in which the reflecting material is deposited, and an upper layer made of a resin not containing the reflecting material.

10. The light-emitting device according to claim 1, further comprising a phosphor member containing a phosphor provided inside the frame body and covering an upper surface of the light-emitting element and an upper surface of Ag plating layer.

11. The light-emitting device according to claim 1, further comprising a lens member having a lens function, wherein the lens member covers at least a part of the frame body and the light-emitting element.

12. A method of manufacturing a light-emitting device comprising:

preparing a base including: a first lead including an element disposal portion and a first wire bonding portion; a second lead including a second wire bonding portion; and a fixing member fixing the first lead and the second lead together, by providing an Au plating layer containing a primary component of Au on at least an upper surface of the first wire bonding portion and at least an upper surface of the second wire bonding portion, and providing an Ag plating layer containing a primary component of Ag disposed apart inwardly from at least a part of an outer circumference of an end portion of the element disposal portion on an upper surface of the element disposal portion in a top view;

disposing a light-emitting element on the upper surface of the element disposal portion;

electrically connecting the light-emitting element and the first wire bonding portion together with a first wire, and electrically connecting the light-emitting element and the second wire bonding portion together with a second wire; and forming a frame body on an upper surface of the base such that the frame body surrounds the light-emitting element and covers an end portion of the Ag plating layer, the first wire bonding portion, and the second wire bonding portion, wherein the Ag playing layer and the Au playing layer covered with the frame body are joined together with a step portion formed, along all edges of the frame body, between the end portion of the Ag plating layer and an upper surface of the Au plating layer in a cross-sectional view.

13. The method of manufacturing the light-emitting device according to claim 12, further comprising:

injecting, after forming of the frame body, a reflecting member made of a reflecting material and a resin into the frame body; and separating the reflecting member into a lower layer containing the reflecting material and an upper layer not containing the reflecting material under a centrifugal force by rotating the base.

14. The method of manufacturing the light-emitting device according to claim 12, further comprising:
   forming, after the forming of the frame body, a phosphor member by filling a phosphor member containing a phosphor into the frame body.

15. The method of manufacturing the light-emitting device according to claim 12, further comprising:
   forming, after the forming of the frame body, a lens member by covering at least a part of the frame body and the light-emitting element with the lens member having a lens function.

16. The method of manufacturing the light-emitting device according to claim 12,
   wherein, during the forming of the frame body, the frame body is formed to cover a whole circumference of an end portion along the end portion of the Ag plating layer.

17. The light-emitting device according to claim 9,
   wherein an upper surface of the lower layer has a constant thickness along the upper surface of the Ag plating layer.

18. The light-emitting device according to claim 2,
   wherein the frame body covers a whole circumference of the end portion of the Ag plating layer.

19. The light-emitting device according to claim 2,
   wherein the frame body covers a part of the first wire and a part of the second wire.

20. The light-emitting device according to claim 2,
   wherein a width of the Ag plating layer covered with the frame body is 10% to 80% relative to a width of a bottom portion of the frame body in a cross-sectional view.

* * * * *